United States Patent
Kifune et al.

(10) Patent No.: US 9,548,107 B1
(45) Date of Patent: Jan. 17, 2017

(54) SEMICONDUCTOR MEMORY DEVICE

(71) Applicant: Kabushiki Kaisha Toshiba, Minato-ku (JP)

(72) Inventors: Naoko Kifune, Tokyo (JP); Masanobu Shirakawa, Chigasaki (JP); Ryo Yamaki, Yokohama (JP); Osamu Torii, Tokyo (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/963,482

(22) Filed: Dec. 9, 2015

Related U.S. Application Data

(60) Provisional application No. 62/190,546, filed on Jul. 9, 2015.

(51) Int. Cl.
G11C 16/26 (2006.01)
G11C 16/04 (2006.01)
G11C 16/08 (2006.01)
G11C 11/56 (2006.01)

(52) U.S. Cl.
CPC ........... *G11C 11/5642* (2013.01); *G11C 16/08* (2013.01); *G11C 16/04* (2013.01); *G11C 16/0483* (2013.01); *G11C 16/26* (2013.01)

(58) Field of Classification Search
CPC ................. G11C 16/0483; G11C 16/26; G11C 2211/5641; G11C 16/08; G11C 16/04; G11C 16/28
USPC ........................... 365/185.03, 185.23, 185.24
See application file for complete search history.

(56) References Cited

U.S. PATENT DOCUMENTS

| | | | | |
|---|---|---|---|---|
| 5,815,439 A | * | 9/1998 | Korsh | G11C 11/56 365/185.03 |
| 5,903,495 A | * | 5/1999 | Takeuchi | G11C 11/5621 365/185.03 |
| 2005/0157560 A1 | * | 7/2005 | Hosono | G11C 16/10 365/185.22 |
| 2005/0201401 A1 | | 9/2005 | Lasser | |
| 2008/0104312 A1 | | 5/2008 | Lasser | |
| 2008/0320064 A1 | * | 12/2008 | Park | G11C 16/28 708/100 |
| 2009/0323412 A1 | * | 12/2009 | Mokhlesi | G11C 11/5642 365/185.02 |
| 2011/0103144 A1 | * | 5/2011 | Wang | G11C 16/0416 365/185.03 |
| 2011/0126080 A1 | | 5/2011 | Wan et al. | |
| 2011/0194347 A1 | | 8/2011 | Chae | |

(Continued)

FOREIGN PATENT DOCUMENTS

| | | |
|---|---|---|
| JP | 2009-59453 | 3/2009 |
| JP | 2011-165305 | 8/2011 |
| JP | 2012-48791 | 3/2012 |

*Primary Examiner* — Ly D Pham
(74) *Attorney, Agent, or Firm* — Oblon, McClelland, Maier & Neustadt, L.L.P.

(57) ABSTRACT

A semiconductor memory device includes a memory cell configured to hold 4-bit data according to a threshold. A first bit of the 4-bit data is established by reading operations using a first to a third read levels. A second bit different from the first bit is established by reading operations using a fourth to a seventh read levels. A third bit different from the first and second bits is established by reading operations using an eighth to an eleventh read levels. A fourth bit different from the first to third bits is established by reading operations using a twelfth to a fifteenth read levels.

15 Claims, 41 Drawing Sheets

(56) References Cited

U.S. PATENT DOCUMENTS

| | | |
|---|---|---|
| 2011/0205805 A1 | 8/2011 | Honma et al. |
| 2012/0054416 A1 | 3/2012 | Kobayashi et al. |
| 2012/0224420 A1* | 9/2012 | Sakurada ................ G11C 8/08 365/185.03 |

* cited by examiner

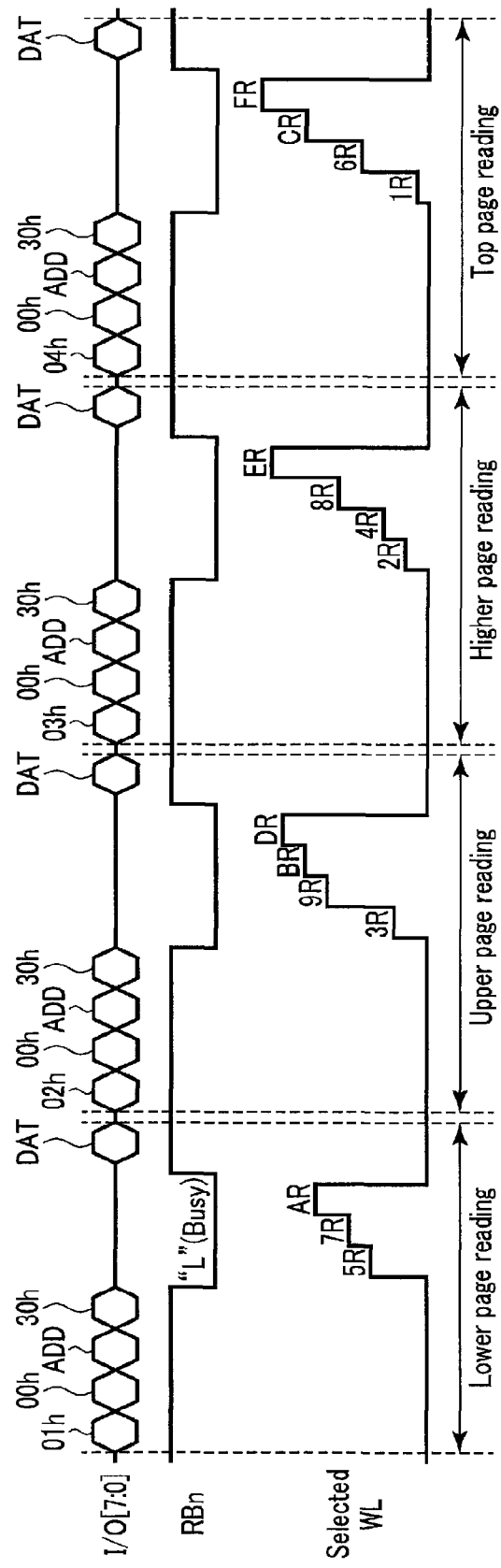
F I G. 11

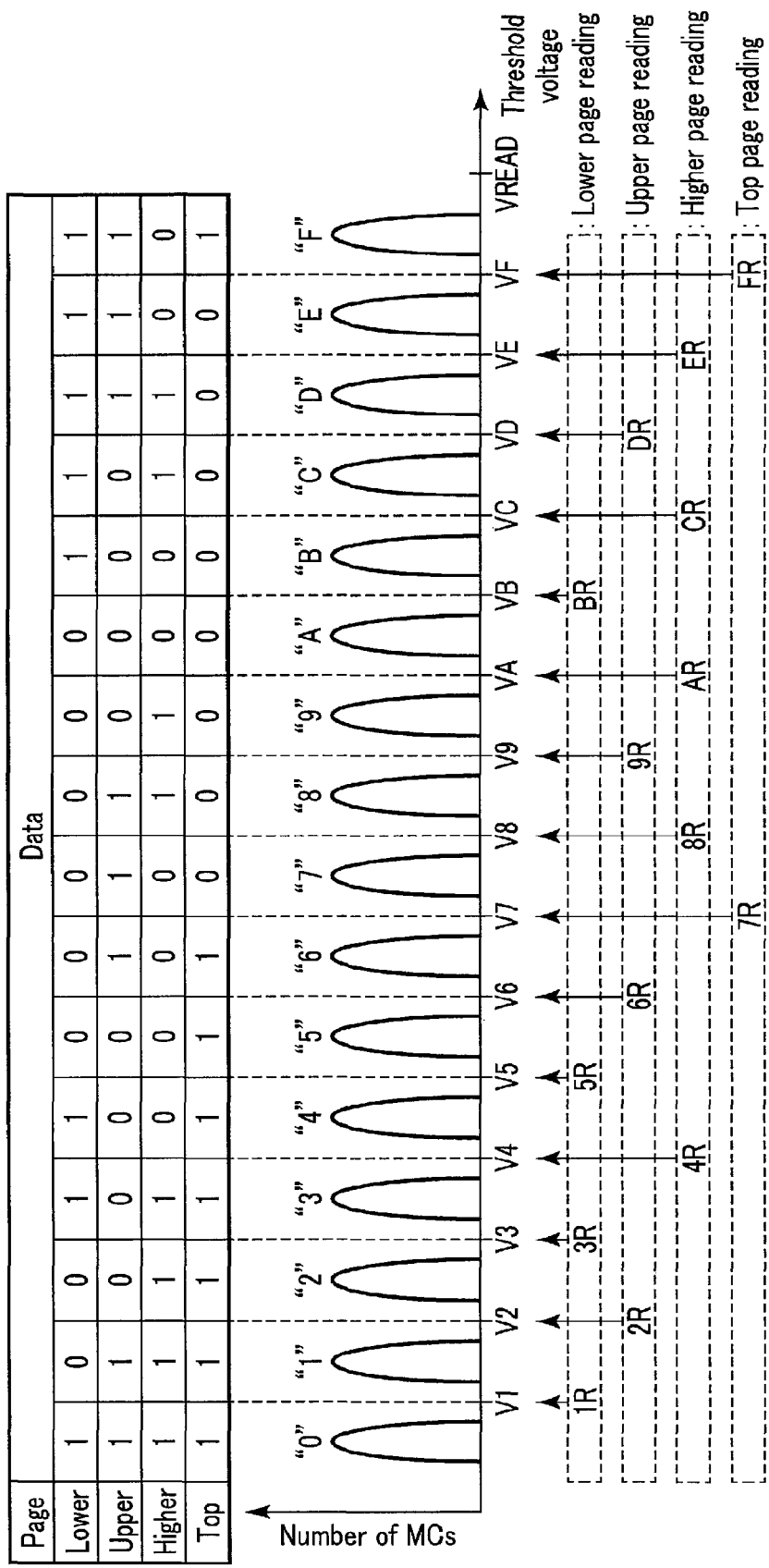
F I G. 21

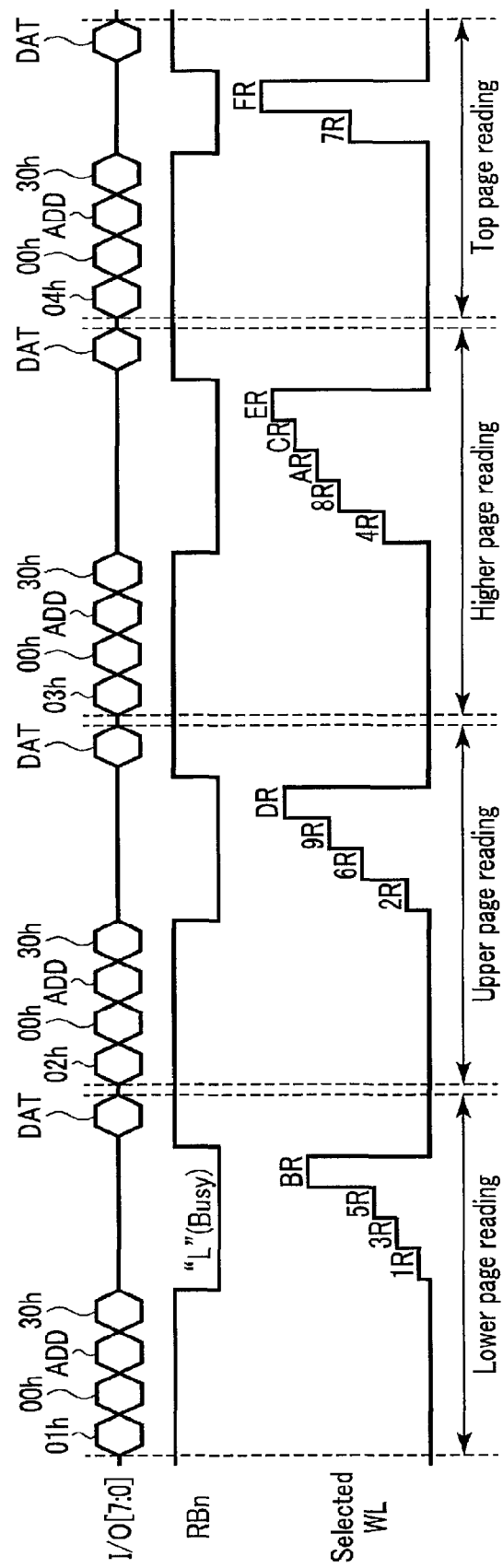
F I G. 22

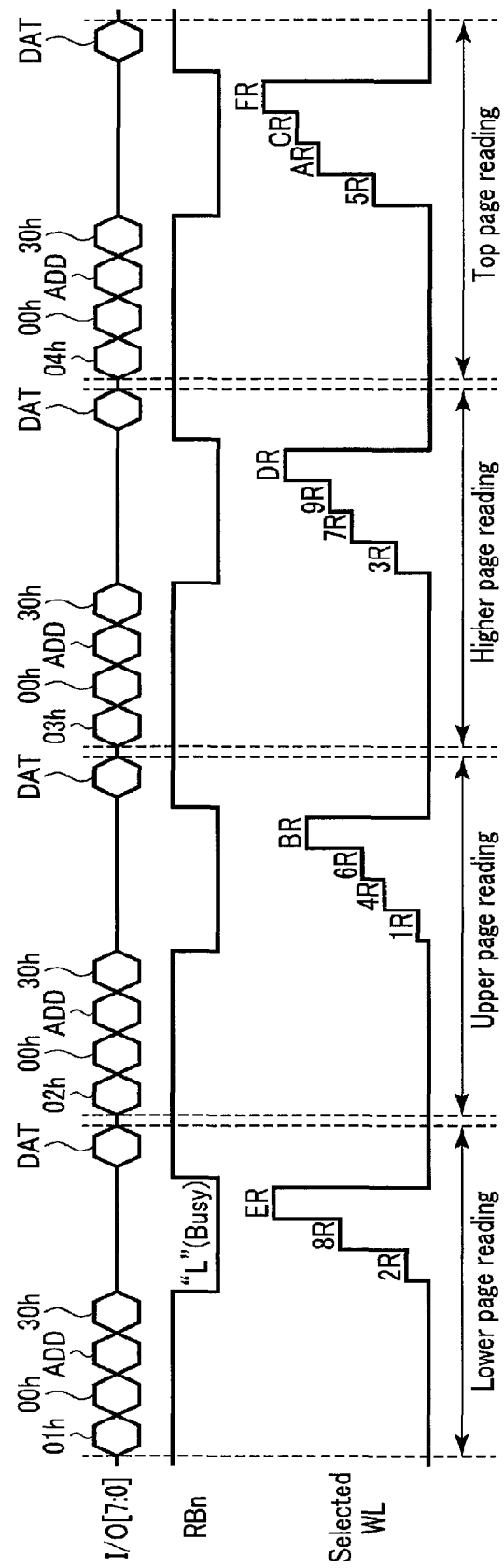
F I G. 24

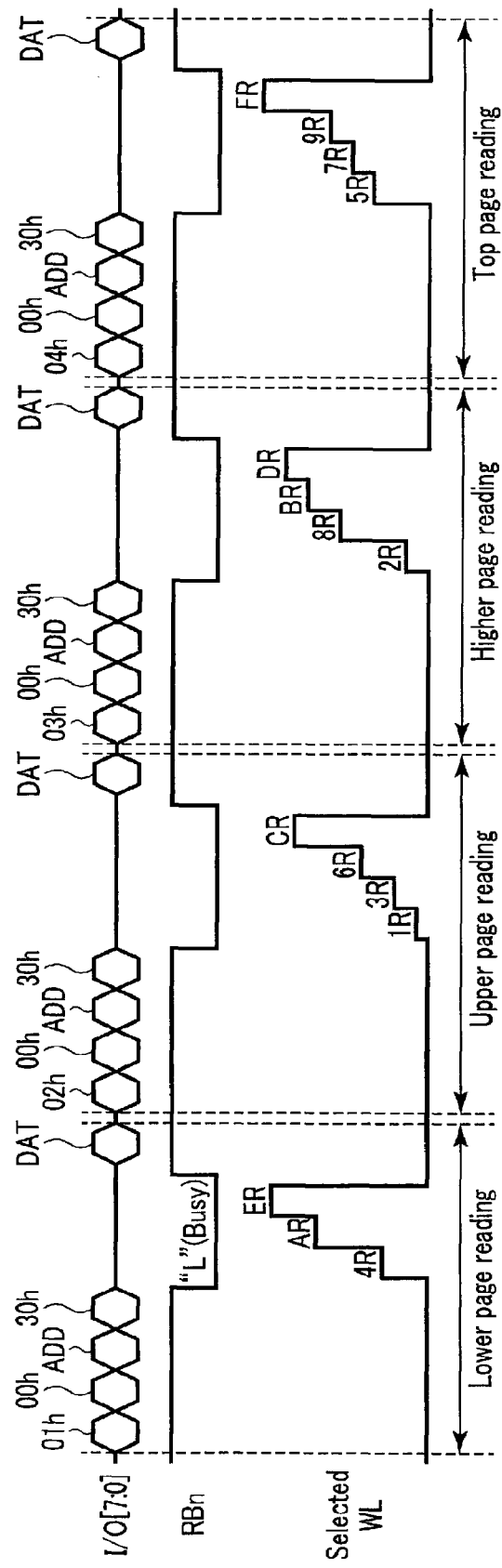
F I G. 30

| Page | Data | | | | | | | | | | | | | | | |
|---|---|---|---|---|---|---|---|---|---|---|---|---|---|---|---|---|
| Lower | 1 | 1 | 0 | 0 | 1 | 1 | 1 | 1 | 1 | 1 | 0 | 0 | 0 | 0 | 0 | |
| Upper | 1 | 0 | 0 | 0 | 0 | 0 | 0 | 1 | 1 | 1 | 1 | 1 | 0 | 0 | 1 | 1 |
| Higher | 1 | 1 | 1 | 0 | 0 | 0 | 1 | 1 | 0 | 0 | 0 | 0 | 0 | 1 | 1 | 1 |
| Top | 1 | 1 | 1 | 1 | 1 | 0 | 0 | 0 | 0 | 1 | 1 | 0 | 0 | 0 | 0 | 1 |

```
    2R    4R              AR                      : Lower page reading
1R            7R                  CR     ER       : Upper page reading
       3R    6R   8R              DR              : Higher page reading
              5R         9R   BR              FR  : Top page reading
```

FIG. 32

| Page | Data | | | | | | | | | | | | | | | |
|---|---|---|---|---|---|---|---|---|---|---|---|---|---|---|---|---|
| Lower | 1 | 1 | 0 | 0 | 0 | 0 | 1 | 1 | 1 | 1 | 1 | 1 | 0 | 0 | 0 | 0 |
| Upper | 1 | 0 | 0 | 0 | 0 | 0 | 0 | 1 | 1 | 0 | 0 | 1 | 1 | 1 | 1 | 1 |
| Higher | 1 | 1 | 1 | 0 | 0 | 1 | 1 | 1 | 0 | 0 | 0 | 0 | 0 | 0 | 1 | 1 |
| Top | 1 | 1 | 1 | 1 | 0 | 0 | 0 | 0 | 0 | 0 | 1 | 1 | 1 | 0 | 0 | 1 |

```
    2R              6R                CR          : Lower page reading
1R                    7R   9R   BR                : Upper page reading
       3R    5R      8R                    ER     : Higher page reading
              4R                AR        DR  FR  : Top page reading
```

FIG. 33

| Page | Data | | | | | | | | | | | | | | |
|---|---|---|---|---|---|---|---|---|---|---|---|---|---|---|---|
| Lower | 1 | 1 | 0 | 0 | 0 | 0 | 0 | 1 | 1 | 1 | 1 | 1 | 0 | 0 | 0 |
| Upper | 1 | 0 | 0 | 0 | 0 | 0 | 1 | 1 | 0 | 0 | 0 | 1 | 1 | 1 | 1 |
| Higher | 1 | 1 | 1 | 0 | 0 | 1 | 1 | 1 | 0 | 0 | 0 | 0 | 0 | 0 | 1 |
| Top | 1 | 1 | 1 | 1 | 0 | 0 | 0 | 0 | 0 | 1 | 1 | 0 | 0 | 1 | 1 |

```
    2R              7R              DR            : Lower page reading
1R            6R    8R        BR                  : Upper page reading
       3R    5R           9R                 FR   : Higher page reading
              4R                AR    CR    ER    : Top page reading
```

FIG. 34

| Page | Data | | | | | | | | | | | | | | |
|---|---|---|---|---|---|---|---|---|---|---|---|---|---|---|---|
| Lower | 1 | 1 | 1 | 1 | 0 | 0 | 0 | 0 | 0 | 1 | 1 | 1 | 0 | 0 |
| Upper | 1 | 0 | 0 | 1 | 1 | 1 | 1 | 0 | 0 | 0 | 0 | 0 | 1 | 1 |
| Higher | 1 | 1 | 0 | 0 | 0 | 0 | 0 | 1 | 1 | 0 | 0 | 1 | 1 | 1 |
| Top | 1 | 1 | 1 | 1 | 0 | 0 | 1 | 1 | 0 | 0 | 0 | 0 | 0 | 1 |

```
                  5R              BR      ER      : Lower page reading
  1R    3R          7R              DR            : Upper page reading
     2R              8R    AR    CR               : Higher page reading
        4R    6R         9R               FR      : Top page reading
```

FIG. 38

| Page | Data | | | | | | | | | | | | | | |
|---|---|---|---|---|---|---|---|---|---|---|---|---|---|---|---|
| Lower | 1 | 1 | 1 | 1 | 1 | 0 | 0 | 0 | 0 | 1 | 1 | 0 | 0 | 0 |
| Upper | 1 | 0 | 0 | 1 | 1 | 0 | 0 | 0 | 0 | 0 | 1 | 1 | 1 | 1 |
| Higher | 1 | 1 | 0 | 0 | 0 | 0 | 0 | 1 | 1 | 1 | 1 | 0 | 0 | 1 |
| Top | 1 | 1 | 1 | 0 | 0 | 1 | 1 | 0 | 0 | 0 | 0 | 0 | 1 | 1 |

```
              6R          AR    CR                : Lower page reading
  1R    3R    5R              BR                  : Upper page reading
     2R              8R              DR    FR     : Higher page reading
        4R        7R    9R                ER      : Top page reading
```

FIG. 39

| Page | Data | | | | | | | | | | | | | | |
|---|---|---|---|---|---|---|---|---|---|---|---|---|---|---|---|
| Lower | 1 | 1 | 1 | 1 | 1 | 0 | 0 | 0 | 0 | 0 | 1 | 1 | 0 | 0 |
| Upper | 1 | 0 | 0 | 1 | 1 | 1 | 1 | 1 | 1 | 0 | 0 | 0 | 0 | 1 |
| Higher | 1 | 1 | 0 | 0 | 0 | 1 | 1 | 0 | 0 | 0 | 0 | 1 | 1 | 1 |
| Top | 1 | 1 | 1 | 1 | 0 | 0 | 0 | 1 | 1 | 0 | 0 | 0 | 1 | 1 |

```
              6R            BR    DR              : Lower page reading
  1R    3R              9R                FR      : Upper page reading
     2R    5R    7R              CR               : Higher page reading
        4R        8R    AR            ER          : Top page reading
```

FIG. 40

| Page | Data | | | | | | | | | | | | | | |
|---|---|---|---|---|---|---|---|---|---|---|---|---|---|---|---|
| Lower | 1 | 1 | 1 | 1 | 1 | 1 | 0 | 0 | 0 | 1 | 1 | 0 | 0 | 0 | 0 |
| Upper | 1 | 0 | 0 | 0 | 1 | 1 | 1 | 1 | 1 | 1 | 0 | 0 | 0 | 0 | 1 |
| Higher | 1 | 1 | 0 | 0 | 0 | 0 | 0 | 1 | 1 | 1 | 1 | 0 | 0 | 1 | 1 |
| Top | 1 | 1 | 1 | 0 | 0 | 1 | 1 | 0 | 0 | 0 | 0 | 0 | 1 | 1 | 1 |

: Lower page reading — 6R, 9R, BR
: Upper page reading — 1R, 4R, AR, FR
: Higher page reading — 2R, 8R, CR, ER
: Top page reading — 3R, 5R, 7R, DR

FIG. 41

| Page | Data | | | | | | | | | | | | | | |
|---|---|---|---|---|---|---|---|---|---|---|---|---|---|---|---|
| Lower | 1 | 1 | 1 | 1 | 1 | 0 | 0 | 1 | 1 | 1 | 0 | 0 | 0 | 0 | 0 |
| Upper | 1 | 0 | 0 | 0 | 0 | 0 | 1 | 1 | 1 | 1 | 1 | 1 | 0 | 0 | 1 |
| Higher | 1 | 1 | 0 | 0 | 1 | 1 | 1 | 1 | 0 | 0 | 0 | 0 | 0 | 1 | 1 |
| Top | 1 | 1 | 1 | 0 | 0 | 0 | 0 | 0 | 0 | 1 | 1 | 0 | 0 | 1 | 1 |

: Lower page reading — 5R, 7R, AR
: Upper page reading — 1R, 6R, CR, FR
: Higher page reading — 2R, 4R, 8R, ER
: Top page reading — 3R, 9R, BR, DR

FIG. 42

| Page | Data | | | | | | | | | | | | | | |
|---|---|---|---|---|---|---|---|---|---|---|---|---|---|---|---|
| Lower | 1 | 1 | 1 | 1 | 1 | 1 | 0 | 0 | 0 | 0 | 0 | 0 | 1 | 1 | 0 | 0 |
| Upper | 1 | 0 | 0 | 0 | 0 | 1 | 1 | 0 | 0 | 0 | 0 | 1 | 1 | 1 | 1 |
| Higher | 1 | 1 | 0 | 0 | 1 | 1 | 1 | 1 | 1 | 0 | 0 | 0 | 0 | 0 | 1 |
| Top | 1 | 1 | 1 | 0 | 0 | 0 | 0 | 0 | 1 | 1 | 0 | 0 | 0 | 1 | 1 | 1 |

: Lower page reading — 6R, CR, ER
: Upper page reading — 1R, 5R, 7R, BR
: Higher page reading — 2R, 4R, 9R, FR
: Top page reading — 3R, 8R, AR, DR

FIG. 43

| Page | Data | | | | | | | | | | | | | | | |
|---|---|---|---|---|---|---|---|---|---|---|---|---|---|---|---|---|
| Lower | 1 | 0 | 0 | 0 | 0 | 0 | 0 | 0 | 0 | 1 | 1 | 1 | 1 | 1 | 1 | 1 |
| Upper | 1 | 1 | 1 | 1 | 0 | 0 | 0 | 0 | 1 | 1 | 1 | 0 | 0 | 0 | 0 | 1 |
| Higher | 1 | 1 | 1 | 0 | 0 | 1 | 1 | 0 | 0 | 0 | 0 | 0 | 0 | 1 | 1 | 1 |
| Top | 1 | 1 | 0 | 0 | 0 | 0 | 1 | 1 | 1 | 1 | 0 | 0 | 1 | 1 | 0 | 0 |

- 1R ... 9R ... : Lower page reading
- 4R ... 8R ... BR ... FR : Upper page reading
- 3R  5R  7R ... DR : Higher page reading
- 2R  6R  AR  CR  ER : Top page reading

F I G. 47

| Page | Data | | | | | | | | | | | | | | | |
|---|---|---|---|---|---|---|---|---|---|---|---|---|---|---|---|---|
| Lower | 1 | 0 | 0 | 0 | 0 | 0 | 0 | 0 | 0 | 1 | 1 | 1 | 1 | 1 | 1 | 1 |
| Upper | 1 | 1 | 1 | 1 | 0 | 0 | 0 | 0 | 0 | 1 | 1 | 0 | 0 | 0 | 1 |  |
| Higher | 1 | 1 | 1 | 0 | 0 | 0 | 1 | 1 | 0 | 0 | 0 | 0 | 1 | 1 | 1 |  |
| Top | 1 | 1 | 0 | 0 | 1 | 1 | 1 | 0 | 0 | 0 | 0 | 1 | 1 | 1 | 0 | 0 |

- 1R ... 9R ... : Lower page reading
- 5R ... AR  CR ... FR : Upper page reading
- 3R  6R  8R ... DR : Higher page reading
- 2R  4R  7R ... BR  ER : Top page reading

F I G. 48

| Page | Data | | | | | | | | | | | | | | | |
|---|---|---|---|---|---|---|---|---|---|---|---|---|---|---|---|---|
| Lower | 1 | 0 | 0 | 0 | 0 | 0 | 0 | 0 | 0 | 1 | 1 | 1 | 1 | 1 | 1 | 1 |
| Upper | 1 | 1 | 1 | 1 | 1 | 0 | 0 | 0 | 0 | 0 | 0 | 1 | 1 | 0 | 0 | 1 |
| Higher | 1 | 1 | 1 | 0 | 0 | 0 | 0 | 1 | 1 | 1 | 0 | 0 | 0 | 0 | 1 | 1 |
| Top | 1 | 1 | 0 | 0 | 1 | 1 | 0 | 0 | 1 | 1 | 1 | 1 | 0 | 0 | 0 | 0 |

- 1R ... 9R ... : Lower page reading
- 5R ... BR  DR  FR : Upper page reading
- 3R  7R  AR  ER : Higher page reading
- 2R  4R  6R  8R  CR : Top page reading

F I G. 49

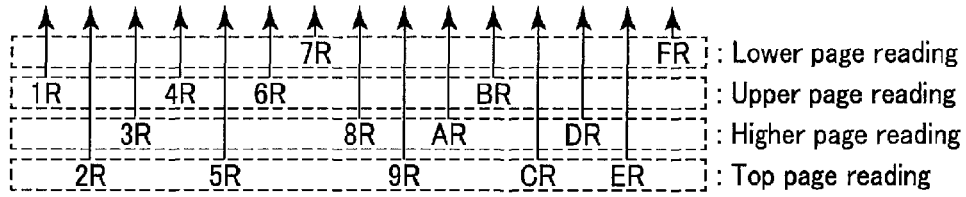
F I G. 50
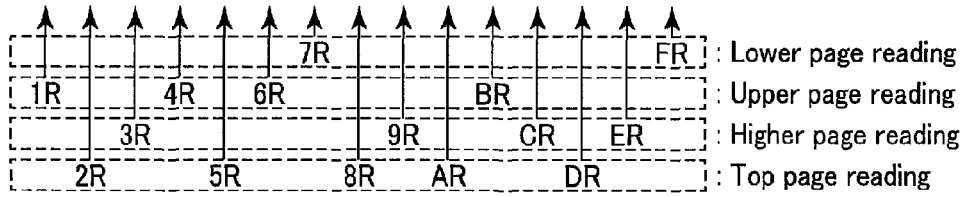
F I G. 51
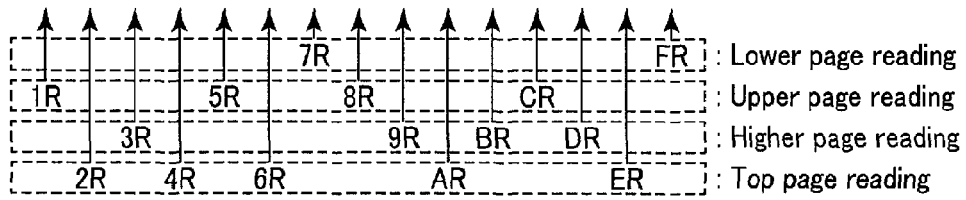
F I G. 52

| Page | Data | | | | | | | | | | | | | | |
|---|---|---|---|---|---|---|---|---|---|---|---|---|---|---|---|
| Lower | 1 | 1 | 1 | 1 | 1 | 1 | 1 | 0 | 0 | 0 | 0 | 0 | 0 | 0 | 1 |
| Upper | 1 | 1 | 1 | 0 | 0 | 0 | 0 | 0 | 0 | 1 | 1 | 0 | 0 | 1 | 1 | 1 |
| Higher | 1 | 0 | 0 | 0 | 0 | 1 | 1 | 1 | 1 | 1 | 0 | 0 | 0 | 1 | 1 |
| Top | 1 | 1 | 0 | 0 | 1 | 1 | 0 | 0 | 1 | 1 | 1 | 1 | 0 | 0 | 0 | 0 |

- - - -: Lower page reading (7R, FR)
- - - -: Upper page reading (3R, 9R, BR, DR)
- - - -: Higher page reading (1R, 5R, AR, ER)
- - - -: Top page reading (2R, 4R, 6R, 8R, CR)

F I G. 53

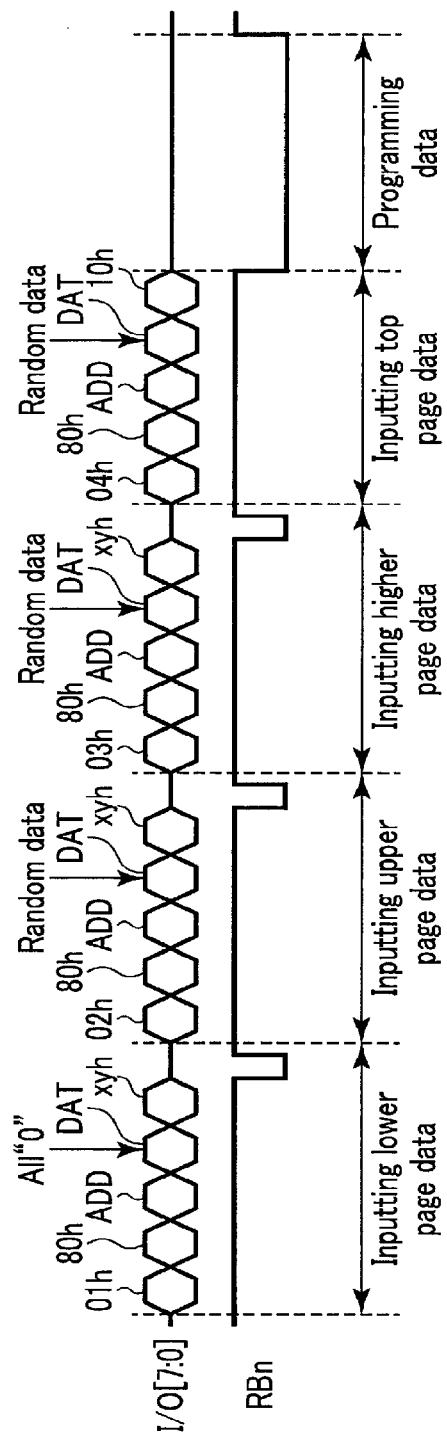
F I G. 54

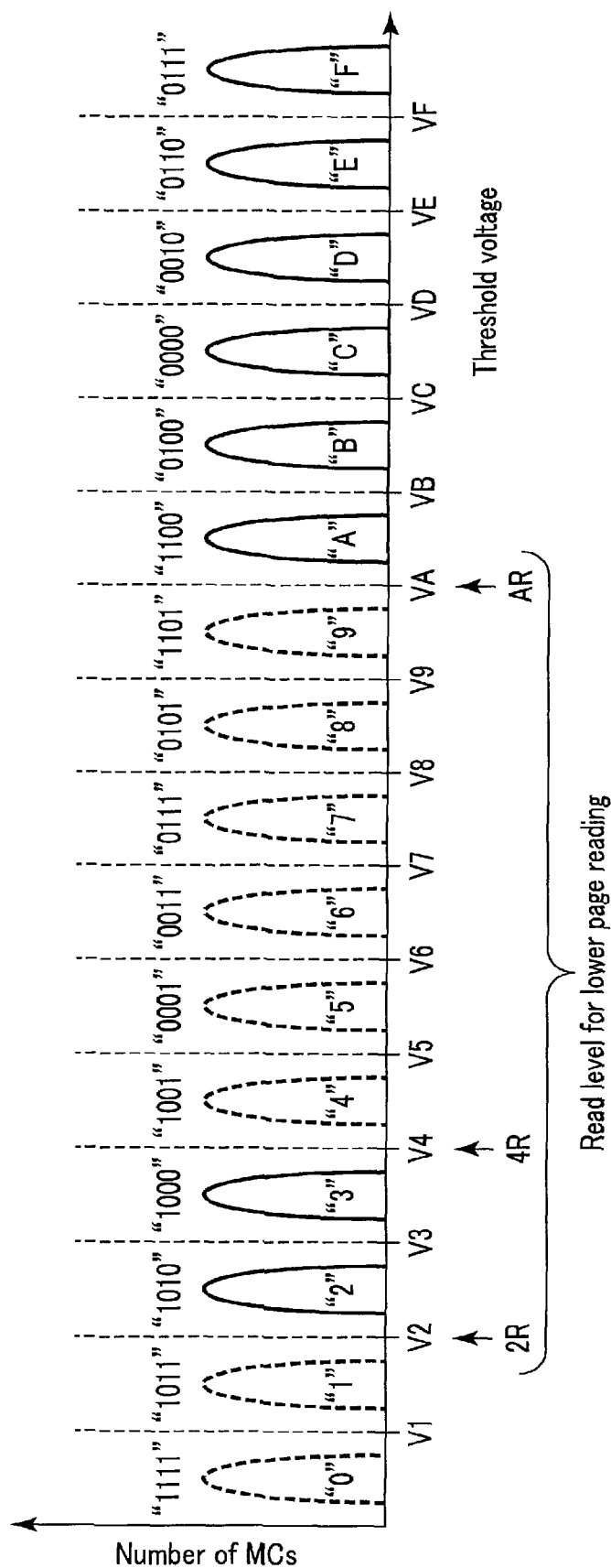
F I G. 55

SEMICONDUCTOR MEMORY DEVICE

CROSS-REFERENCE TO RELATED APPLICATIONS

This application claims the benefit of U.S. Provisional Application No. 62/190,546, filed Jul. 9, 2015, the entire contents of which are incorporated herein by reference.

FIELD

Embodiments described herein relate generally to a semiconductor memory device.

BACKGROUND

A NAND flash memory is widespread as data storage device.

BRIEF DESCRIPTION OF THE DRAWINGS

FIG. 11 is a timing chart of various signals during a reading operation according to the third embodiment;

FIG. 21 is a diagram illustrating possible data, a threshold distribution, and read levels for memory cells according to a seventh embodiment;

FIG. 22 is a timing chart of various signals during a reading operation according to the seventh embodiment;

FIGS. 24 and 25 are timing charts of various signals during a reading operation according to the eighth embodiment;

FIGS. 30 and 31 are timing charts of various signals during a reading operation according to the tenth embodiment;

FIGS. 32 to 44 are diagrams illustrating possible data, a threshold distribution, and read levels for memory cells according to an eleventh embodiment;

FIGS. 45 to 49 are diagrams illustrating possible data, a threshold distribution, and read levels for memory cells according to a twelfth embodiment;

FIGS. 50 to 53 are diagrams illustrating possible data, a threshold distribution, and read levels for memory cells according to a thirteenth embodiment;

FIG. 54 is a command sequence during a writing operation according to a fourteenth embodiment; and FIG. 55 is a diagram illustrating a threshold distribution for memory cells according to the fourteenth embodiment.

DETAILED DESCRIPTION

In general, according to one embodiment, a semiconductor memory device includes a memory cell configured to hold 4-bit data according to a threshold. A first bit of the 4-bit data is established by reading operations using a first to a third read levels. A second bit of the 4-bit data is established by reading operations using a fourth to a seventh read levels. The second bit is different from the first bit. A third bit of the 4-bit data is established by reading operations using an eighth to an eleventh read levels. The third bit is different from the first and second bits. A fourth bit of the 4-bit data is established by reading operations using a twelfth to a fifteenth read levels. The fourth bit is different from the first to third bits. The first to fifteenth read levels are different voltages.

1. First Embodiment

A semiconductor memory device according to a first embodiment will be described. As the semiconductor memory device, a NAND flash memory with memory cells arranged on a semiconductor substrate in a two dimensional manner will be described by way of example.

1. 1 Configuration 1. 1. 1 General Configuration of the Memory System

Figure 1:
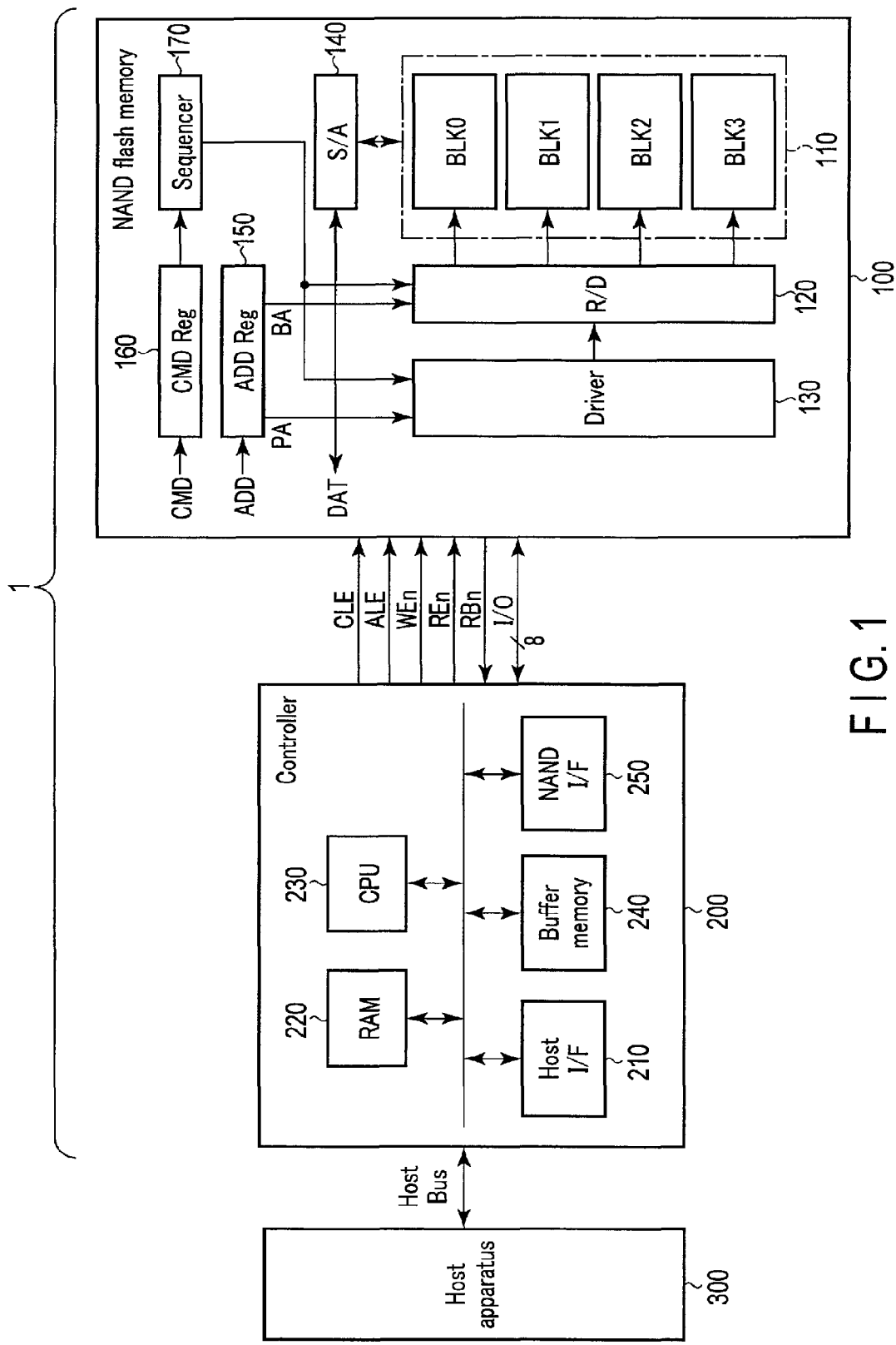
FIG. 1 is a block diagram of a memory system according to a first embodiment.

First, a general configuration of a memory system including the semiconductor memory device according to the present embodiment will be described using FIG. 1. FIG. 1 is a block diagram of the memory system according to the present embodiment.

As depicted in FIG. 1, a memory system 1 includes a NAND flash memory 100 and a controller 200. For example, a combination of the NAND flash memory 100 and the controller 200 may provide one semiconductor device. Examples of such a semiconductor device include a memory card such as an SD™ card and an SSD (Solid State Drive).

The NAND flash memory 100 includes a plurality of memory cells and stores data in a nonvolatile manner. The controller 200 is connected to the NAND flash memory 100 by a NAND bus and to a host apparatus by a host bus. The controller 200 controls the NAND flash memory 100, and in response to an instruction from the host apparatus 300, accesses the NAND flash memory 100. The host apparatus 300 is, for example, a digital camera or a personal computer. The host bus is, for example, a bus conforming to an SD™ interface.

The NAND bus transmits and receives signals in conformity to a NAND interface. Specific examples of the signals include an address latch enable signal ALE, a command latch enable signal CLE, a write enable signal WEn, a read enable signal REn, a ready busy signal RBn, and an I/O signal I/O.

The signals CLE and ALE are signals notifying the NAND flash memory 100 that the input signals I/O to the NAND flash memory 100 are a command and an address, respectively. The signal WEn is a signal asserted at a low level to allow an input signal I/O to be loaded into the NAND flash memory 100. The signal REn is a signal also asserted at the low level to allow an output signal I/O to be read from the NAND flash memory 100. The ready busy signal RBn is a signal indicating whether the NAND flash memory 100 is in a ready state (the state in which the NAND flash memory 100 can receive an instruction from the controller 200) or in a busy state (the state in which the NAND flash memory 100 is prevented from receiving an instruction from the controller 200). The low level of the ready busy signal RBn is indicative of the busy state. The I/O signals I/O are, for example, 8-bit signals. The I/O signals are the substances of data transmitted and received between the NAND flash memory 100 and the controller 200 and are a command, an address, write data, read data, and the like.

1. 1. 2 Configuration of the Controller

With continued reference to FIG. 1, a configuration of the controller 200 will be described. As depicted in FIG. 1, the controller 200 includes a host interface circuit 210, an embedded memory (RAM) 220, a processor (CPU) 230, a buffer memory 240, and a NAND interface circuit 250.

The host interface circuit 210 is connected to the host apparatus 300 via the host bus to transfer an instruction and data received from the host apparatus 300 to the processor 230 and the buffer memory 240. Furthermore, in response to an instruction from the processor 230, the host interface circuit 210 transfers the data in the buffer memory 240 to the host apparatus 300.

The processor 230 controls operations of the whole controller 200. For example, upon receiving a write instruction from the host apparatus 300, the processor 230 issues, in response to the instruction, a write instruction to the NAND interface circuit 250. This also applies to reading or erasing. Additionally, the processor 230 executes various processes for managing the NAND flash memory 100 such as wear leveling.

The NAND interface circuit 250 is connected to the NAND flash memory 100 via the NAND bus to communicate with the NAND flash memory 100. Based on an instruction from the processor 230, the NAND interface circuit 250 outputs the signals ALE, CLE, WEn, and REn to the NAND flash memory 100. Furthermore, during writing, the NAND interface circuit 250 transfers a write command issued by the processor 230 and write data in the buffer memory 240 to the NAND flash memory 100 as I/O signals I/O. Moreover, during reading, the NAND interface circuit 250 transfers the read command issued by the processor 230 to the NAND flash memory 100 as an I/O signal I/O and further receives the data read from the NAND flash memory 100 as an I/O signal I/O and transfers the data to the buffer memory 240.

The buffer memory 240 temporarily holds write data and read data.

The embedded memory 220 is a semiconductor memory, for example, a DRAM, and is used as a work area for the processor 230. The embedded memory 220 holds firmware that allows the NAND flash memory 100 to be managed, various management tables, and the like.

1. 1. 3 Configuration of the NAND Flash Memory 100

1. 1. 3. 1 General Configuration of the NAND Flash Memory 100

Now, a configuration of the NAND flash memory 100 will be described. As depicted in FIG. 1, the NAND flash memory 100 includes a memory cell array 110, a row decoder 120, a driver circuit 130, a sense amplifier 140, an address register 150, a command register 160, and a sequencer 170.

The memory cell array 110 includes, for example, four blocks BLK (BLK0 to BLK3) each of which is a set of a plurality of nonvolatile memory cells associated with rows and columns. The memory cell array 110 stores data provided by the controller 200.

The row decoder 120 selects one of the blocks BLK0 to BLK3 and further selects a row direction the selected block BLK.

The driver circuit 130 supplies a voltage to the selected block BLK via the row decoder 120.

The sense amplifier 140, during data reading, senses data read from the memory cell array 110 and outputs the data DAT to the controller 200. During data writing, the sense amplifier 140 transfers write data DAT received from the controller 200 to the memory cell array 110.

The address register 150 holds an address ADD received from the controller 200. The command register 160 holds a command CMD received from the controller 200.

The sequencer 170 controls operations of the whole NAND flash memory 100 based on the command CMD held in the command register 160.

1. 1. 3. 2 Configuration of the Block BLK

Figure 2:
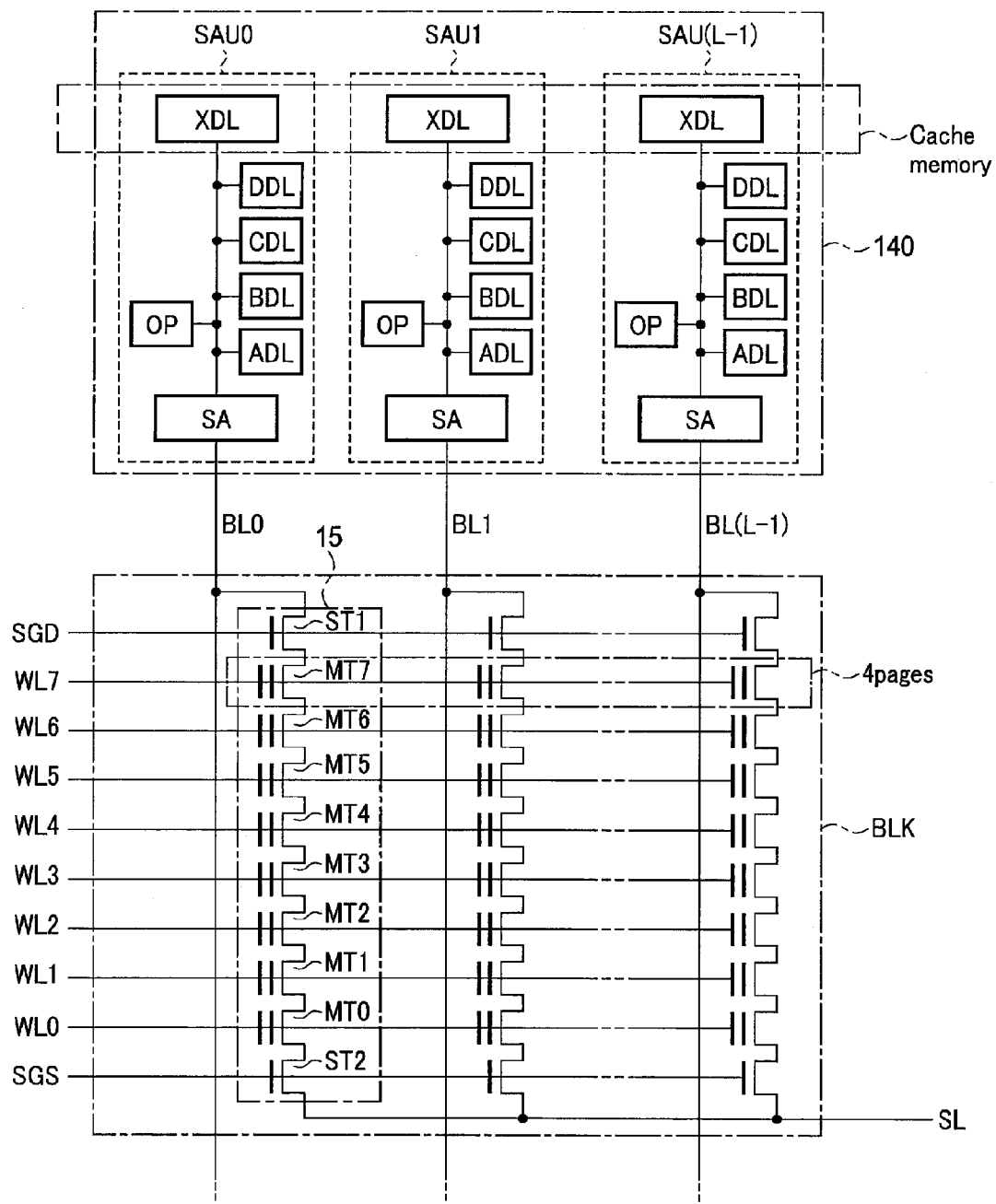
FIG. 2 is a block diagram of blocks and a sense amplifier according to the first embodiment.

Now, a configuration of the block BLK will be described using FIG. 2. FIG. 2 is a circuit diagram of the blocks BLK and the sense amplifier 140.

As depicted in FIG. 2, the block BLK includes a plurality of NAND strings 15. Each of the NAND strings includes, for example, eight memory cell transistors MT (MT0 to MT7) and selection transistors ST1, ST2. The memory cell transistor MT includes a control gate and a charge storage layer to hold data in a nonvolatile manner. The memory cell transistors MT are connected together in series between a source of the selection transistor ST1 and a drain of the selection transistor ST2.

Gates of the selection transistors ST1 and ST2 in the same block are connected in common to selection gate lines SGD and SGS, respectively. Similarly, control gates of the memory cell transistors MT0 to MT7 in the same block are connected in common to word lines WL0 to WL7, respectively.

Furthermore, drains of the selection transistors ST1 in the NAND strings 15 in the same column in the memory cell array 110 are connected in common to bit lines BL (BL0 to BL(L−1), (L−1) is a natural number of 1 or more). That is, the bit line BL connects the NAND strings 15 together in common among a plurality of blocks BLK. Moreover, sources of a plurality of selection transistor ST2 are connected in common to a source line SL.

In the present example, one memory cell transistor MT can hold 4-bit data. The respective bits of the 4-bit data is referred to as a lower bit, an upper bit, a higher bit, and a top bit in order from the lowest bit. A set of the lower bits held in the memory cells connected to the same word line is referred to as a "lower page". A set of the upper bits held in the memory cells connected to the same word line is referred to as an "upper page". A set of the higher bits held in the memory cells connected to the same word line is referred to as a "higher page". A set of the top bits held in the memory cells connected to the same word line is referred to as a "top page". In other words, four pages are assigned to one word line WL. The block BLK, including eight word lines WL, has a capacity equivalent to 32 pages. In other words, the "page" may also be defined as a part of a memory space defined by the memory cells. Data writing and reading may be performed for each page (this reading method is referred to as page-by-page reading). Furthermore, data is erased in units of the blocks BLK.

The memory cell array 110 may be configured such that memory cell transistors are three-dimensionally stacked above a semiconductor substrate. Such a configuration is described in, for example, U.S. patent application Ser. No. 12/407,403 entitled "Three dimensional Stacked Nonvolatile Semiconductor Memory" and filed on Mar. 19, 2009. The configuration is also described in U.S. patent application Ser. No. 12/406,524 entitled "Three dimensional Stacked Nonvolatile Semiconductor Memory" and filed on Mar. 18, 2009, U.S. patent application Ser. No. 12/679,991 entitled "Nonvolatile Semiconductor Storage Device and Method of Manufacturing the Same" and filed on Mar. 25, 2010, and U.S. patent application Ser. No. 12/532,030 entitled "Semiconductor Memory and Method for Manufacturing the Same" and filed on Mar. 23, 2009. These patent applications are entirely incorporated herein by reference.

1. 1. 3. 3 Configuration of the Sense Amplifier 140

Now, a configuration of the sense amplifier 140 will be described with continued reference to FIG. 2. As depicted in FIG. 2, the sense amplifier 140 includes sense amplifier units SAU (SAU0 to SAU(L−1)) provided for the respective bit lines BL.

Each of the sense amplifier units SAU includes a sense amplifier module SA, an arithmetic module OP, and five latch circuits ADL, BDL, CDL, DDL, and XDL.

The sense amplifier module SA senses data read onto the corresponding bit line BL, and applies a voltage to the bit line BL according to write data. That is, the sense amplifier module SA is a module that directly controls the bit line BL.

The latch circuits ADL, BDL, CDL, and DDL temporarily hold read data and write data. The arithmetic module OP performs various arithmetic operations such as a logical add (OR) operation, a logical multiply (AND) operation, and an exclusive logical add (XOR) operation on data held in the latch circuits ADL, BDL, CDL, and DDL.

The sense amplifier module SA, the latch circuits ADL, BDL, CDL, and DDL, and the arithmetic module OP are connected together by a bus so as to be able to transmit and receive data to and from one another. The bus is connected further to a latch circuit XDL.

Data is input to and output from the sense amplifier 140 via the latch circuit XDL. That is, data received from the controller 200 is transferred to the latch circuits ADL, BDL, CDL, and DDL or the sense amplifier module SA. Furthermore, data from the latch circuits ADL, BDL, CDL, and DDL or the sense amplifier module SA is transmitted to the controller 200 via the latch circuit XDL. The latch circuit XDL functions as a cache memory for the NAND flash memory 100. Therefore, even when the latch circuits ADL, BDL, CDL, and DDL are in use, the NAND flash memory 100 can be set to the ready state as long as the latch circuit XDL is idle.

1. 1. 3. 3 Held Data and Threshold Voltages for the Memory Cell Transistors

Figure 3:
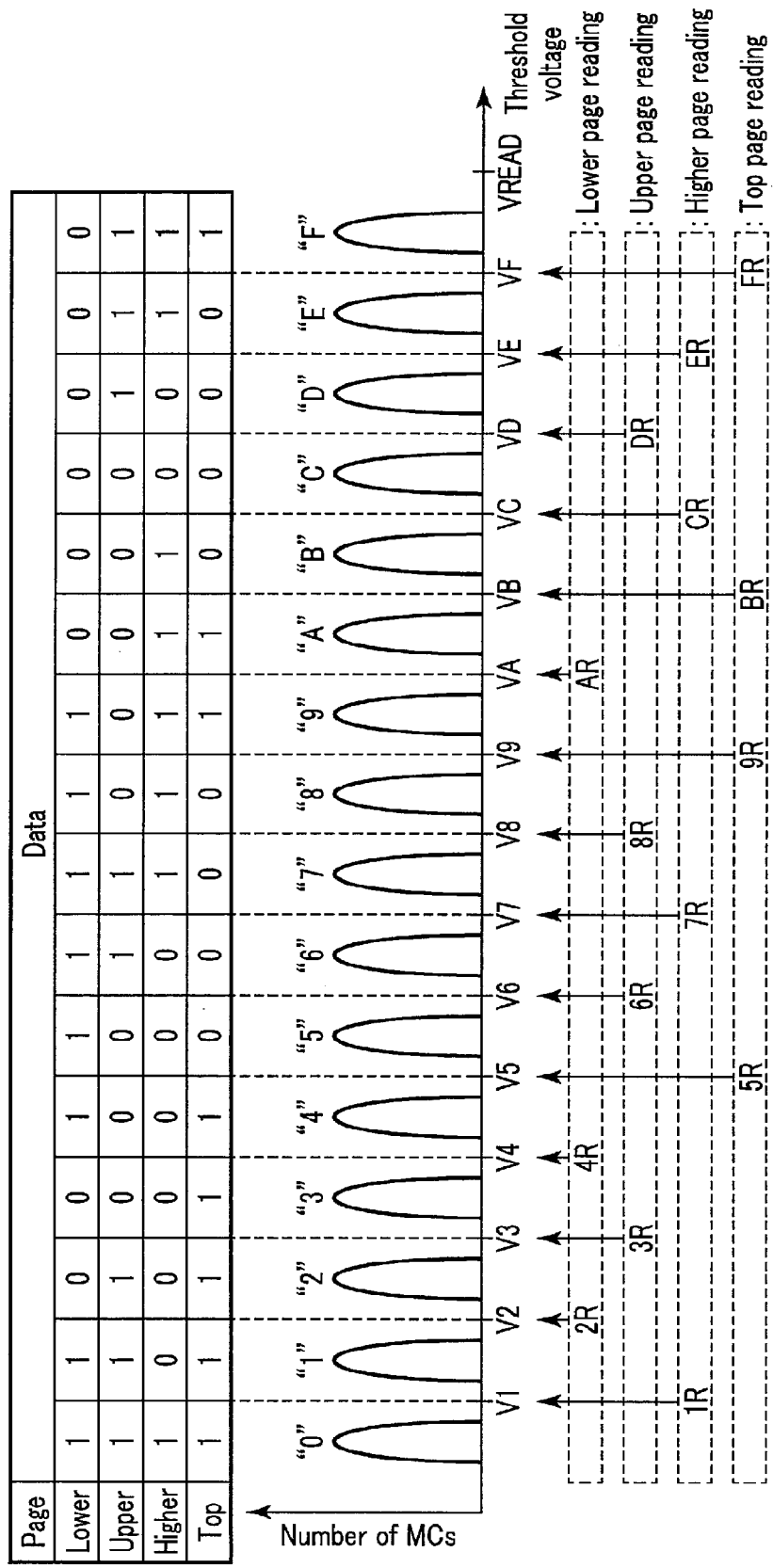
FIG. 3 is a diagram illustrating possible data, a threshold distribution, and read levels for memory cells according to the first embodiment.

Now, held data, threshold voltages, and read levels for data for the memory cell transistors MT will be described with reference to FIG. 3. FIG. 3 is a diagram illustrating possible data, a threshold distribution, and voltages used during reading, for the memory cell transistors MT.

As described above, the memory cell transistor MT can hold 4-bit data according to the threshold voltage. Data expressed by the 4 bits are referred to as "0" data, "1" data, "2" data, . . . , and "F" data in hexadecimal notation in order from data with the lowest threshold voltage.

The threshold voltage for the memory cell transistor MT holding "0" data is lower than a voltage V1 and corresponds to a data erase state. The threshold voltage for the memory cell transistor MT holding "1" data is the voltage V1 or higher and lower than a voltage V2 (>V1). The threshold voltage for the memory cell transistor MT holding "2" data is the voltage V1 or higher and lower than a voltage V3 (>V2). The threshold voltage for the memory cell transistor MT holding "3" data is the voltage V3 or higher and lower than a voltage V4 (>V3). The threshold voltage for the memory cell transistor MT holding "4" data is the voltage V4 or higher and lower than a voltage V5 (>V4). The threshold voltage for the memory cell transistor MT holding "5" data is the voltage V5 or higher and lower than a voltage V6 (>V5). The threshold voltage for the memory cell transistor MT holding "6" data is the voltage V6 or higher and lower than a voltage V7 (>V6). The threshold voltage for the memory cell transistor MT holding "7" data is the voltage V7 or higher and lower than a voltage V8 (>V7). The threshold voltage for the memory cell transistor MT holding "9" data is the voltage V9 or higher and lower than a voltage VA (>V9). The threshold voltage for the memory cell transistor MT holding "A" data is the voltage VA or higher and lower than a voltage VB (>VA). The threshold voltage for the memory cell transistor MT holding "B" data is the voltage VB or higher and lower than a voltage VC (>VB). The threshold voltage for the memory cell transistor MT holding "C" data is the voltage VC or higher and lower than a voltage VD (>VC). The threshold voltage for the memory cell transistor MT holding "D" data is the voltage VD or higher and lower than a voltage VE (>VD). The threshold voltage for the memory cell transistor MT holding "E" data is the voltage VE or higher and lower than a voltage VF (>VE). The threshold voltage for the memory cell transistor MT holding "F" data is the voltage VE or higher and lower than a voltage VREAD. The "F" data included in the 4-bit data corresponds to data with the highest threshold voltage.

Furthermore, this threshold distribution is achieved by writing of the 4-bit (4-page) data including the lower bit, the upper bit, the higher bit, and the top bit. That is, relations between the above-described data in hexadecimal notation and the lower bit, the upper bit, the higher bit, and the top bit are as follows.

"0" data: "1111" (represented in an order of the top bit, the higher bit, the upper bit, and the lower bit)

"1" data: "1011"

"2" data: "1010"

"3" data: "1000"

"4" data: "1001"

"5" data: "0001"
"6" data: "0011"
"7" data: "0111"
"8" data: "0101"
"9" data: "1101"
"A" data: "1100"
"B" data: "0100"
"C" data: "0000"
"D" data: "0010"
"E" data: "0110"
"F" data: "1110"

As illustrated above, only 1 bit of the 4 bits changes between data corresponding to adjacent threshold levels.

Therefore, when the lower bit is read, a voltage corresponding to a boundary where the value ("0" or "1") of the lower bit changes may be used. This also applies to the upper bit, the higher bit, and the top bit.

That is, as depicted in FIG. 3, the lower page may be read by using, as read levels, the voltage V2 that distinguishes the "1" data from the "2" data, the voltage V4 that distinguishes the "3" data from the "4" data, and the voltage VA that distinguishes the "9" data from the "A" data. Reading operations using the voltages V2, V4, and VA are referred to as reading operations 2R, 4R, and AR.

The reading operation 2R is a process of determining whether or not the threshold voltage for the memory cell transistor MT is lower than the voltage V2. The reading operation 4R is a process of determining whether or not the threshold voltage for the memory cell transistor MT is lower than the voltage V4. The reading operation AR is a process of determining whether or not the threshold voltage for the memory cell transistor MT is lower than the voltage VA.

The upper page may be read by using, as read levels, the voltage V3 that distinguishes the "2" data from the "3" data, the voltage V6 that distinguishes the "5" data from the "6" data, the voltage V8 that distinguishes the "7" data from the "8" data, and the voltage VD that distinguishes the "C" data from the "D" data. Reading operations using the voltages V3, V6, V8, and VD are referred to as reading operations 3R, 6R, 8R, and DR.

The reading operation 3R is a process of determining whether or not the threshold voltage for the memory cell transistor MT is lower than the voltage V3. The reading operation 6R is a process of determining whether or not the threshold voltage for the memory cell transistor MT is lower than the voltage V6. The reading operation 8R is a process of determining whether or not the threshold voltage for the memory cell transistor MT is lower than the voltage V8. The reading operation DR is a process of determining whether or not the threshold voltage for the memory cell transistor MT is lower than the voltage VD.

Furthermore, the higher page may be read by using, as read levels, the voltage V1 that distinguishes the "0" data from the "1" data, the voltage V7 that distinguishes the "6" data from the "7" data, the voltage VC that distinguishes the "B" data from the "C" data, and the voltage VE that distinguishes the "D" data from the "E" data. Reading operations using the voltages V1, V7, VC, and VE are referred to as reading operations 1R, 7R, CR, and ER.

The reading operation 1R is a process of determining whether or not the threshold voltage for the memory cell transistor MT is lower than the voltage V1 (In other words, whether or not the held data is "0"). The reading operation 7R is a process of determining whether or not the threshold voltage for the memory cell transistor MT is lower than the voltage V7. The reading operation CR is a process of determining whether or not the threshold voltage for the memory cell transistor MT is lower than the voltage VC. The reading operation ER is a process of determining whether or not the threshold voltage for the memory cell transistor MT is lower than the voltage VE.

The top page may be read by using, as read levels, the voltage V5 that distinguishes the "4" data from the "5" data, the voltage V9 that distinguishes the "8" data from the "9" data, the voltage VB that distinguishes the "A" data from the "B" data, and the voltage VF that distinguishes the "E" data from the "F" data. Reading operations using the voltages V5, V9, VB, and VF are referred to as reading operations 5R, 9R, BR, and FR.

The reading operation 5R is a process of determining whether or not the threshold voltage for the memory cell transistor MT is lower than the voltage V5. The reading operation 9R is a process of determining whether or not the threshold voltage for the memory cell transistor MT is lower than the voltage V9. The reading operation BR is a process of determining whether or not the threshold voltage for the memory cell transistor MT is lower than the voltage VB. The reading operation FR is a process of determining whether or not the threshold voltage for the memory cell transistor MT is lower than the voltage VF (whether or not the held data is "F").

1. 2 Reading Operation

Now, a method for reading data in the NAND flash memory 100 according to the present embodiment will be described.

1. 2. 1 First Example

Figure 4:
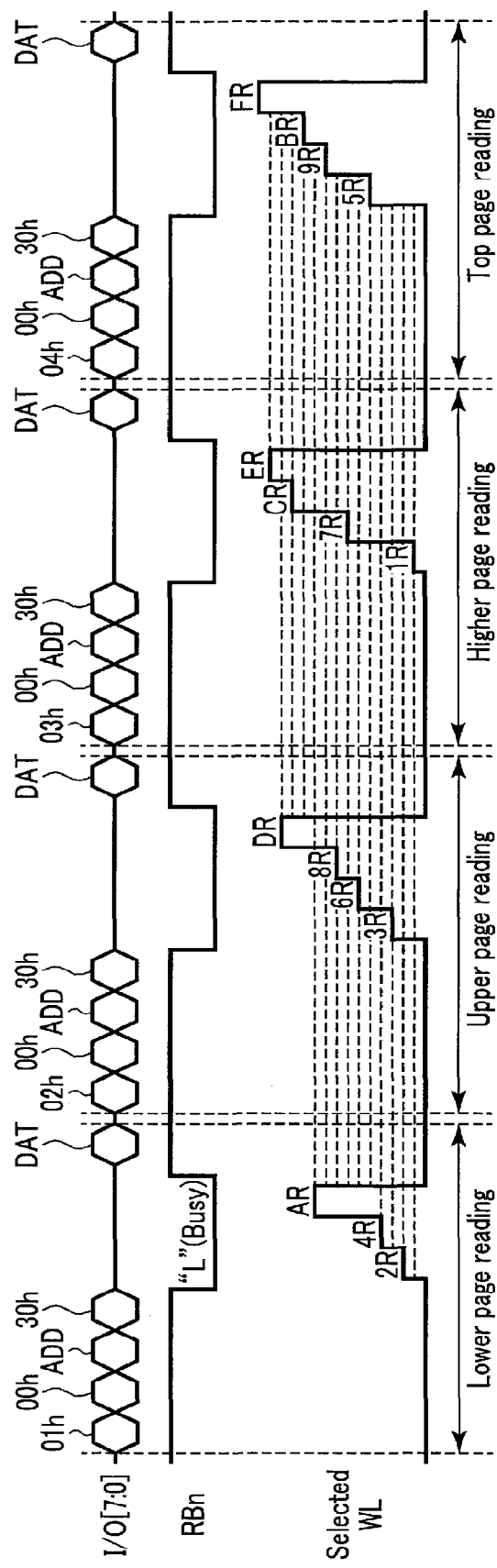
FIGS. 4 to 6 are timing charts of various signals during a reading operation according to a first embodiment.

First, a first example of the reading method will be described. The first example is an example where the controller 200 issues a read command for each page. This method is referred to as page-by-page reading. FIG. 4 is a timing chart illustrating how the I/O signal I/O, the ready/busy signal RBn, and the selected word line WL operate during a reading operation in the present example.

As depicted in FIG. 4, the controller 200 issues and transmits commands "01h" and "00h" to the NAND flash memory 100. The command "01h" is a command that declares access to the lower page. The command "00h" is a command that declares that an address is to be input. The commands are stored in, for example, the command register 160 in the NAND flash memory 100.

Subsequently, the controller 200 issues the address of an area to be accessed, further issues a command "30h", and transmits the address and the command to the NAND flash memory 100. The address ADD is stored in, for example, the address register 150, and the command "30h" is stored in the command register 160. The command "30h" is a command that orders the NAND flash memory 100 to perform a reading operation. FIG. 4 illustrates that the address ADD is transmitted during one cycle. However, for the NAND interface, the address is transmitted, for example, over five cycles. Instead of representing the address ADD as "01h" or the like, it is also preferable to contain page information in a part of the address transmitted over a plurality of cycles.

Therefore, in response to the holding of the command "30h" in the command register 160, the sequencer 170 in the NAND flash memory 100 starts an operation of reading lower page data corresponding to the page address held in the address register 150 and is set to the busy state.

In the NAND flash memory 100, the sense amplifier 140 precharges the bit line BL to a predetermined potential. Moreover, the row decoder 120 selects the word line WL corresponding to the address received from the controller

200. Then, the driver circuit 130 applies the voltage VREAD to the unselected word lines WL, while applying a read voltage VCGRV to the selected word line WL. The read voltage VCGRV corresponds to the read level described with reference to FIG. 3. As depicted in FIG. 4, during reading of the lower page, voltages V2, V4, and VA are sequentially applied to the selected word line WL to perform the reading operations 2R, 4R, and AR.

For example, data read during the reading operation 2R is stored in the latch circuit DDL. Subsequently, the arithmetic module OP performs a logical operation on data read during the reading operation 4R and data in the latch circuit DDL, and stores the logical operation result in the latch circuit DDL. Finally, the arithmetic module OP performs a logical operation on data read during the reading operation AR and the data in the latch circuit DDL, and stores the logical operation result is stored in the latch circuit DDL. That is, the three reading operations 2R, 4R, and AR establish the lower page data. Then, the data in the latch circuit DDL is transferred to the latch circuit XDL to set the NAND flash memory 100 to the ready state.

In response to the setting of the NAND flash memory 100 to the ready state, the controller 200 toggles the signal RE. Then, in synchronism with the signal RE, the lower page data in the latch circuit XDL is transmitted to the controller 200.

When the upper page data is read, the command "02h" is issued instead of the command "01h" as depicted in FIG. 4. The command "02h" is a command declaring to the NAND flash memory 100 that the upper page is to be accessed. Subsequent operations are substantially similar to the corresponding operations for the lower page data. Differences are that voltages V3, V6, V8, and VD are used as read levels, that data is established by four reading operations, and that a latch circuit CDL is used. The upper data stored in the CDL is transferred to the XDL and then transmitted to the controller 200.

When the higher page data is read, the command "03h" is issued which declares to the NAND flash memory 100 that the higher page is to be accessed. Voltages V1, V7, VC, and VE are used as read levels, and data is established by four reading operations. In the sense amplifier 140, a latch circuit BDL holds the higher page data. The higher data stored in the BDL is transferred to the XDL and then transmitted to the controller 200.

When the top page data is read, the command "04h" is issued which declares to the NAND flash memory 100 that the top page is to be accessed. Voltages V5, V9, VB, and VF are used as read levels, and data is established by four reading operations. In the sense amplifier 140, a latch circuit ADL holds the top page data. The top data stored in the ADL is transferred to the XDL and then transmitted to the controller 200.

1. 2. 2 Second Example

Figure 5:
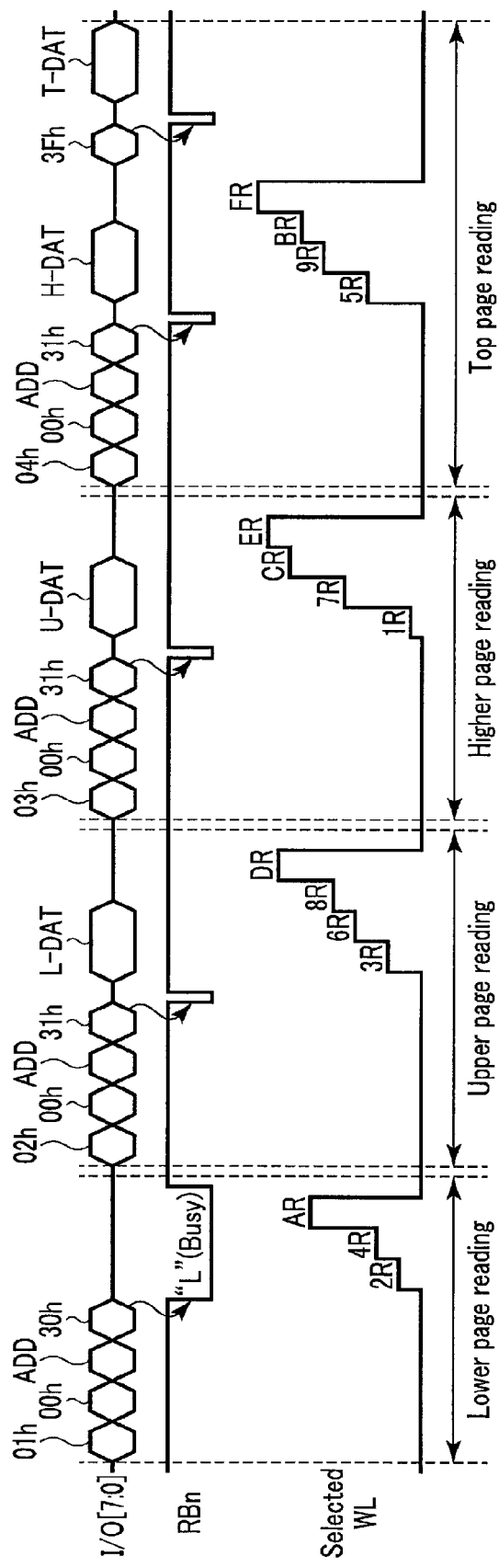

Now, a second example of the reading method will be described using FIG. 5. FIG. 5 is a timing chart illustrating how the I/O signal I/O, the ready/busy signal RBn, and the selected word line WL operate during the reading operation in the present example. The second example is also an example of page-by-page reading. A difference from the first example is that reading of data from the second and subsequent pages and transfer of the last read data to the controller can be executed in parallel. Differences from FIG. 4 will be described below.

As depicted in FIG. 5, the controller 200 issues and transmits commands "01h" and "00h" to the NAND flash memory 100. Then, in reading the upper page data, the controller 200 issues a command "31h" instead of the command "30h" and transmits the command "31h" to the NAND flash memory 100. The command "31h" is a command that allows the last read data to be transferred to the XDL and allows the last specified page data to be read. Therefore, in response to hold the command "31h" in the command register 160, the NAND flash memory 100 starts reading the upper page and performs reading operations 3R, 6R, 8R, and DR.

Upon receiving the command "31h" the NAND flash memory 100 is temporarily set to the busy state, transfers the last read data (in the present example, the lower page data) to the XDL, and quickly returns to the ready state. At this time, the lower page data is stored in the latch circuit XDL, and thus, the controller 200 can read lower page data L-DAT by toggling the signal RE. The NAND flash memory 100 starts reading the upper page based on the address ADD received immediately before reception of the command "31h", and performs the reading operations 3R, 6R, 8R, and DR. That is, reading of the upper page from the memory cell array 110 in the NAND flash memory 100 to sense amplifier 140 is performed in parallel with transfer of the lower page data from the cache memory XDL in the NAND flash memory 100 to the controller 200.

Then, similarly, the controller 200 can read the higher page data and the top page data from the memory cell array 110 by issuing the address ADD designating the higher page, the command "31h", the address ADD designating the top page, and the command "31h". In parallel with these operations, the controller 200 can perform transfer of the upper page data and higher page data from the cache memory XDL to the controller 200.

After that, the controller 200 issues a command "3Fh" to the NAND flash memory 100. Upon receiving the command "3Fh", the NAND flash memory transfers the top page data to the XDL, and further transfers the top page data to the controller 200.

1. 2. 3 Third Example

Figure 6:
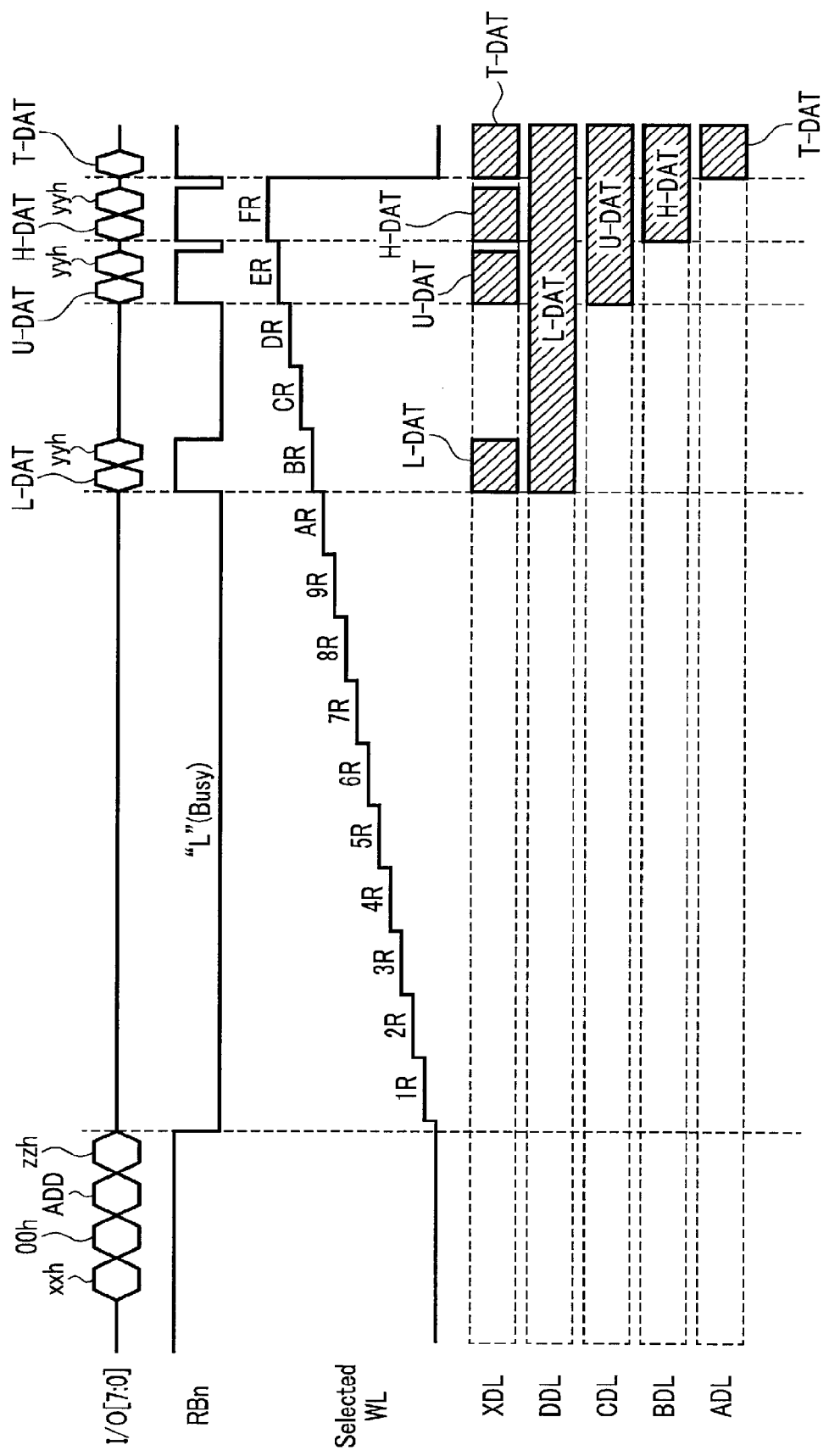

Now, a third example of the reading method will be described. The third example is not an example of page-by-page reading but is an example of a method in which the reading operations 1R to FR are sequentially performed by a single command input. This method is referred to as sequential reading. FIG. 6 is a timing chart illustrating how the I/O signal I/O, the ready/busy signal RBn, the selected word line, and the latch circuits ADL, BDL, CDL, DDL, and XDL operate during the reading operation according to the present example. Only differences from the first and second examples will be described below.

As depicted in FIG. 6, the controller 200 sequentially issues commands "xxh" and "00h", the address ADD, and a command "zzh". The command "xxh" is a prefix command that allows sequential reading to be performed. The command "zzh" is a command that instructs the NAND flash memory 100 to perform reading.

In response to the command "zzh", the NAND flash memory 100 is set to the busy state. A difference from the first and second examples is that the voltage of the selected word line WL is sequentially stepped up to V1, V2 V3, . . . VF. Then, at timings when the voltages are applied, the respective reading operations 1R, 2R, 3R, . . . FR are performed.

The higher page data is read during the 1R and thus stored in the latch circuit BDL. Furthermore, the lower page data is read during the 2R and thus stored in the BDL. Moreover, the upper page data is read during the 3R and thus stored in the CDL. Then, the lower page data is read during the 4R, and the arithmetic module OP performs a logical operation on this data and the data already held in the DDL. The result is held in the DDL. Similar operations are subsequently performed.

Then, when the reading operation AR is completed, the final lower page data L-DAT is stored in the latch circuit DDL (the lower page data is established by the 2R, the 4R, and the AR). The L-DAT is transferred to the latch circuit XDL. Therefore, the NAND flash memory 100 is set to the ready state. The controller 200 can read the data L-DAT from the XDL by toggling the signal RE. Then, the controller 200 issues a command "yyh" in order to read the upper page data. Then, the NAND flash memory 100 is set to the busy state.

When the reading operation DR is completed, the final upper page data U-DAT is stored in the latch circuit CDL (the upper page data is established by the 3R, the 6R, the 8R, and the DR). The U-DAT is transferred to the latch circuit XDL. Therefore, at this time, the controller 200 can read the data U-DAT from the XDL.

Subsequently, similarly, the higher page data is established when the reading operation ER is completed, and the top page data is established when the reading operation FR is completed. Then, when the data is established and the established data is transferred to the XDL, the controller 200 can read the data from the XDL.

1. 3 Effects of the Present Embodiment

In the configuration according to the present embodiment, the NAND flash memory that can hold 4-bit data (16-level data) establishes the lower page data by three reading operations and establishes the other page data by four reading operations. The method of establishing one page by three reading operations and three pages by four reading operations is hereinafter referred to as "3-4-4-4 mapping". The 3-4-4-4 mapping allows the number of reading operations needed to establish the data to be averaged among the pages. Thus, the rate of occurrence of errors during reading can be reduced, improving the reliability of reading operations. This will be described below.

The 1R is an operation of establishing a memory cell transistor with the threshold at an erase level. On the other hand, the FR is an operation of establishing a memory cell transistor with the threshold at an F level, which is the highest level. Among the 16 distributed thresholds, the erase level is more likely to be affected by disturbance and to suffer varying threshold than the other threshold levels. Thus, "0" data corresponding to the threshold at the erase level tends to be mistaken, during reading, for "1" data, which is one level higher than the "0" data. Furthermore, the threshold at the "F" level is a state where the memory cell transistor has the highest potential. Consequently, the threshold is likely to change to a smaller value, which is more stable. Therefore, the "F" data tends to be mistaken, during reading, for the "E" data, which is one level lower than the "F" data.

In this regard, according to the present embodiment, the operations 1R and FR, in which errors are likely to occur, are performed during different page reading operations (in the present example, a higher page reading and a top page reading). Therefore, concentration of errors at particular pages can be suppressed, improving the reliability of reading.

Moreover, in the present embodiment, the cache memory XDL can be quickly released. That is, the 3-4-4-4 mapping involves a pattern in which the first page data is established during the AR or the BR. In the present embodiment, the first page data (lower page data) is established during the AR as described in FIG. 6. Therefore, at this time, the NAND flash memory 100 can transmit data to the controller 200, enabling a reduction in read latency.

In the present embodiment, in the page-by-page reading, the lower page, the upper page, the higher page, and the top page are read in this order by way of example. However, the embodiment is not limited to this order, and the order of page reading may be changed. This also applies to description of a second embodiment and subsequent embodiments. Furthermore, the bit sequences of the lower page, the upper page, the higher page, and the top page may be changed to one another. For example, in FIG. 3, the bit sequence of the upper page may be changed to the bit sequence of the higher page. This also applies to the second and subsequent embodiments.

2. Second Embodiment

Now, a semiconductor memory device according to a second embodiment will be described. The present embodiment corresponds to the first embodiment in which the 3-4-4-4 mapping is used and in which the relationship between the 16-level data and the read levels is modified. Only differences from the first embodiment will be described below.

Figure 7:
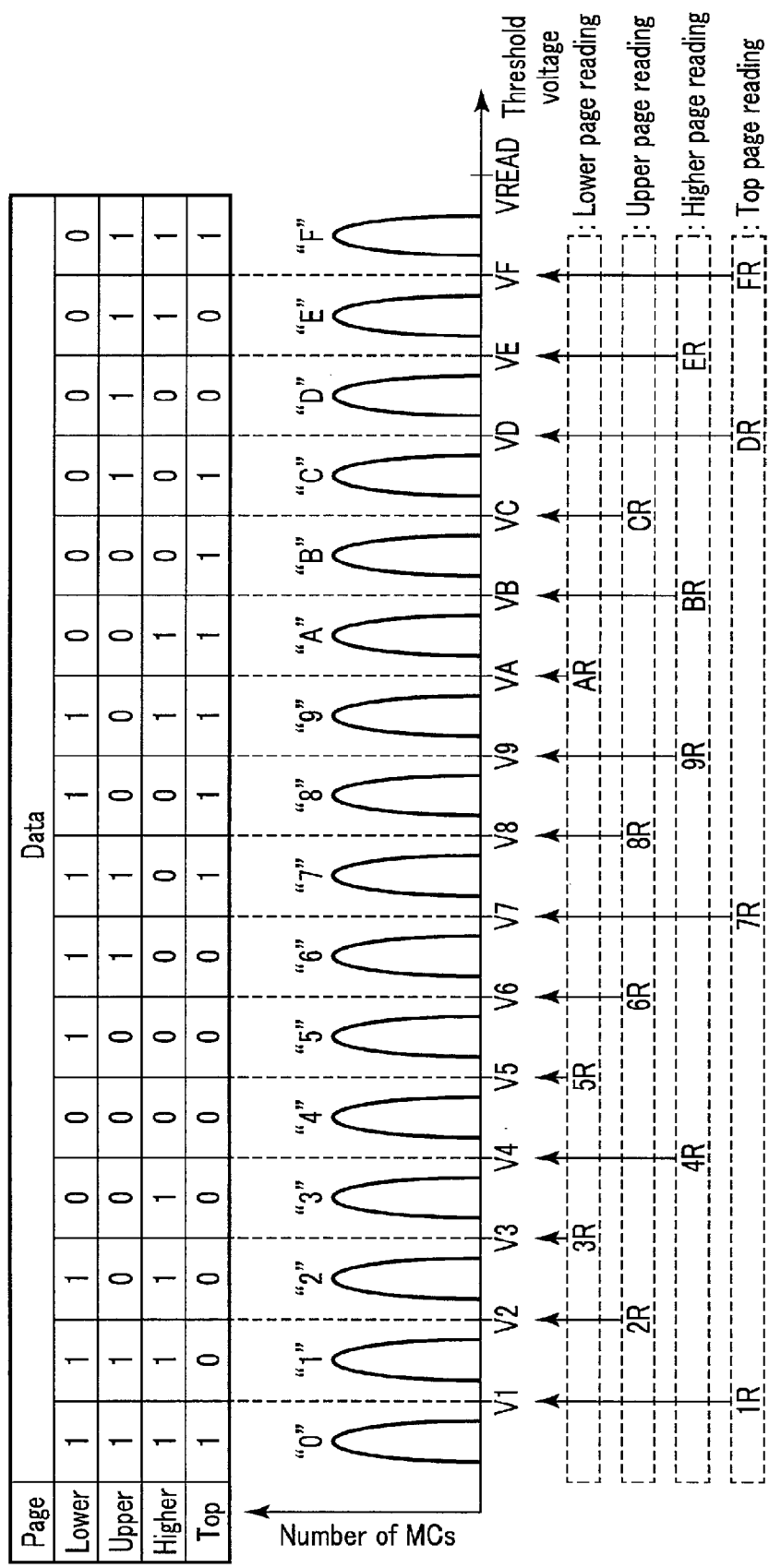
FIG. 7 is a diagram illustrating possible data, a threshold distribution, and read levels for memory cells according to a second embodiment.

2. 1 Relations Between the Held Data and the Read Levels for the Memory Cell Transistor FIG. 7 is a diagram illustrating possible data, a threshold distribution, and voltages used for reading, for the memory cell transistors according to the present embodiment, and corresponds to FIG. 3 described in the first embodiment.

In the present embodiment, the relations between the "0" to "F" data that may be assumed by the memory cell transistors and the lower bit, the upper bit, the higher bit, and the top bit are as follows.

"0" data: "1111"
"1" data: "1110"
"2" data: "0101"
"3" data: "0100"
"4" data: "0000"
"5" data: "0001"
"6" data: "0011"
"7" data: "1011"
"8" data: "1001"
"9" data: "1101"
"A" data: "1100"
"B" data: "1000"
"C" data: "1010"
"D" data: "0010"
"E" data: "0110"
"F" data: "1110"

That is, the mapping in the present example is a mirror pattern of FIG. 3 described in the first embodiment. In other words, the mapping is achieved by inverting the 4-bit data corresponding to the "0" to "F" data in FIG. 3 ("0111" corresponding to "0" data, "1111" corresponding to "F" data, "0110" corresponding to "1" data, "1101" corresponding to "E" data, . . . ), shifting the 4-bit data of the "0" to "F" data (i.e. all the data) to higher thresholds once, and then assigning "1111", which overflows by the shifting, to the "0" data (so-called "bit cyclic shift to the right"), changing the lower page with the top page, and changing the upper page with the higher page. The number of shifts is not limited to one and the data may be shifted a plurality of times. The direction of the shift is not limited toward higher thresholds but may be toward lower thresholds. Furthermore, the pages may be changed to one another, and the present embodiment is not limited to the above-described changing method. Moreover, "1111" is preferably assigned to the "0" data. However, the present embodiment may not be limited to this, the 4-bit data corresponding to the "0" data may be shifted.

The lower page may be read using the voltages V3, V5, and VA. The upper page may be read using the voltages V2, V6, V8, and VC. The higher page may be read using the voltages V4, V9, VB, and VE. The top page may be read using the voltages V1, V7, VD, and VF.

2. 2 Reading Operation

Now, a method for reading data in the NAND flash memory 100 according to the present embodiment will be described.

<Page-by-Page Reading>

Figure 8:
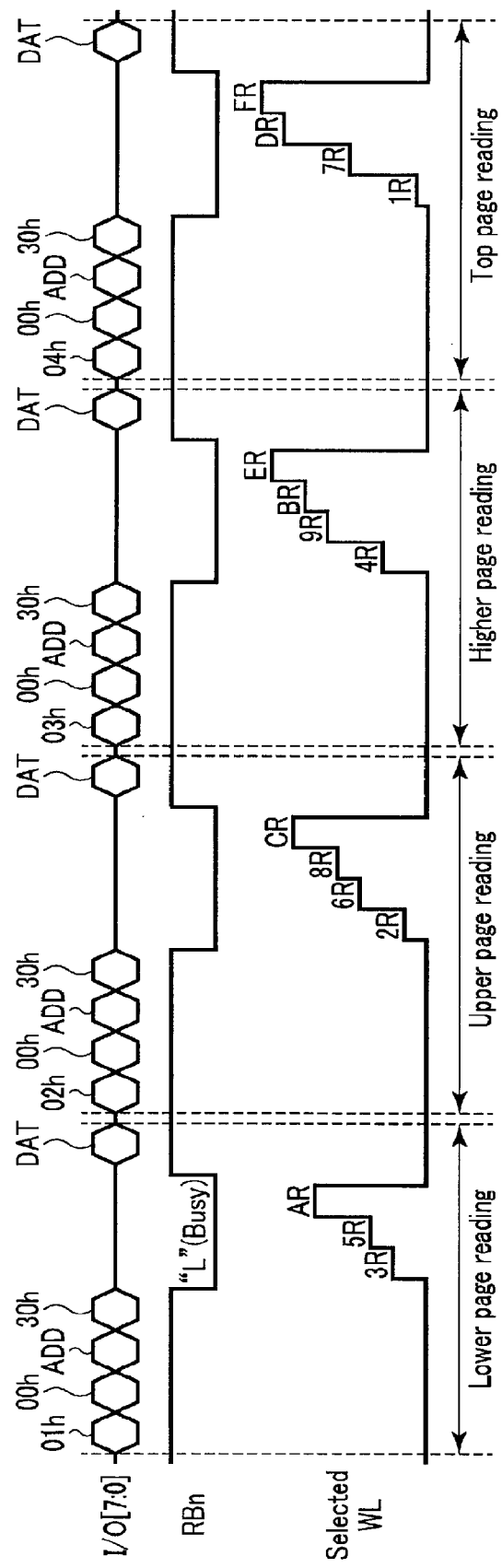
FIGS. 8 and 9 are timing charts of various signals during a reading operation according to the second embodiment.

First, a case of page-by-page reading will be described using FIG. 8. FIG. 8 is a timing chart illustrating how the I/O signal I/O, the ready/busy signal REn, and the selected word line WL operate during the reading operation according to the present example.

As depicted in FIG. 8, in reading of the lower page, the voltage of the selected word line WL is sequentially stepped up to V3, V5, and VA to allow the reading operations 3R, 5R, and AR to be performed. The three reading operations establish the lower page data.

In reading of the upper page, the voltage of the selected word line WL is sequentially stepped up to V2, V6, V8, and VC to allow the reading operations 2R, 6R, 8R, and CR to be performed. The four reading operations establish the upper page data.

In reading of the higher page, the voltage of the selected word line WL is sequentially stepped up to V4, V9, VB, and VE to allow the reading operations 4R, 9R, BR, and ER to be performed. The four reading operations establish the higher page data.

In reading of the top page, the voltage of the selected word line WL is sequentially stepped up to V1, V7, VD, and VF to allow the reading operations 1R, 7R, DR, and FR to be performed. The four reading operations establish the top page data.

Also in the present example, reading using the command "31h" may be performed which is described with reference to FIG. 5 for the first embodiment.

<Sequential Reading>

Figure 9:
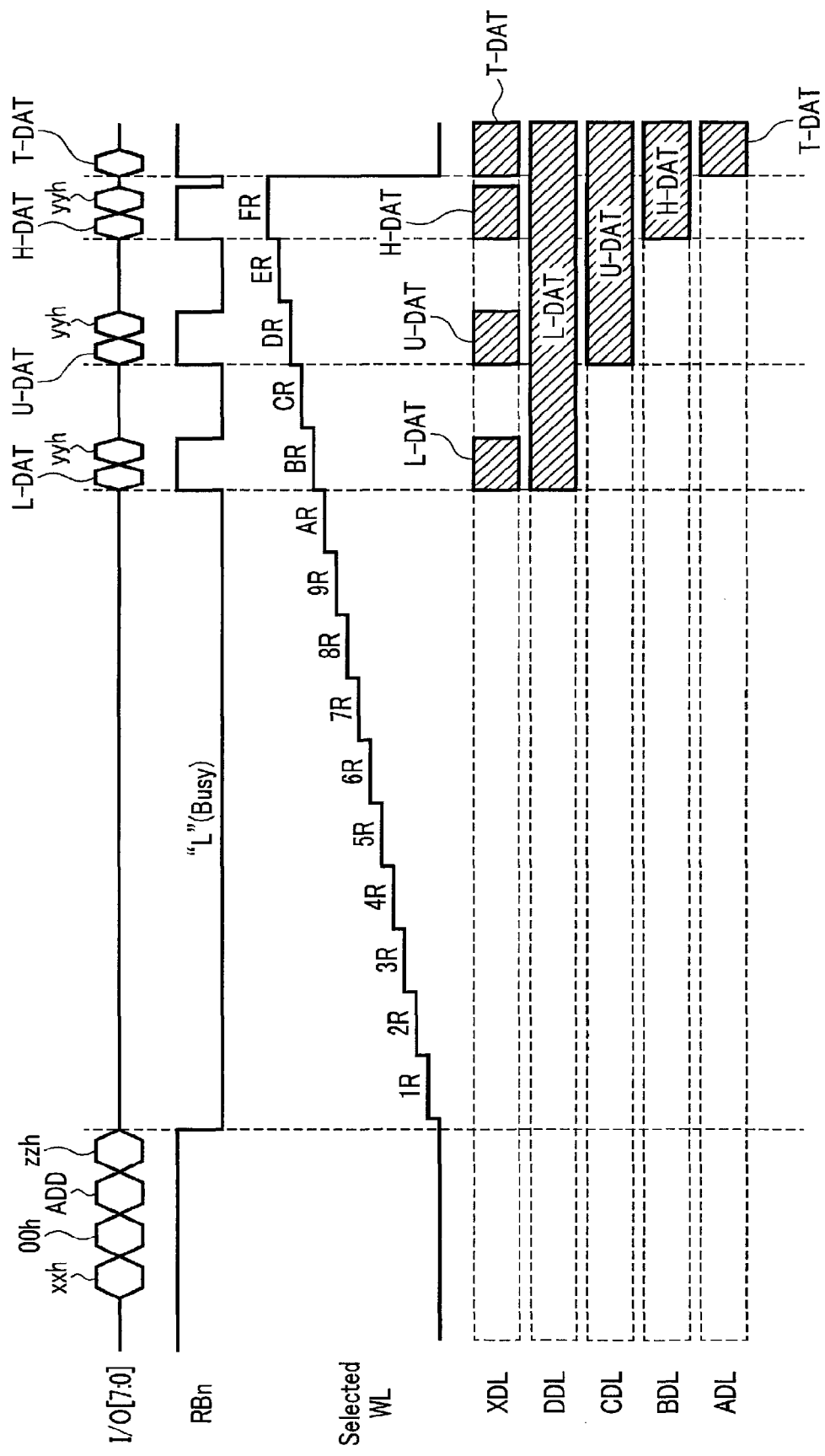

Now, a case of sequential reading will be described using FIG. 9. FIG. 9 is a timing chart illustrating how the I/O signal I/O, the ready/busy signal RBn, the selected word line WL, and the latch circuits ADL, BDL, CDL, DDL, and XDL operate during the reading operation according to the present example.

As depicted in FIG. 9, a difference from FIG. 6 described in the first embodiment is that the upper page data is established when the reading operation CR is completed.

2. 3 Effects of the Present Embodiment

The configuration according to the present embodiment allows the reliability of reading operations to be improved by using the 3-4-4-4 mapping. The lower page data, among the 4-page data, is established first at the AR, enabling the cache memory XDL to be released early.

3. Third Embodiment

Now, a semiconductor memory device according to a third embodiment will be described. The present embodiment relates to 3-4-4-4 mapping different from the 3-4-4-4 mapping in the first and second embodiments. Only differences from the first embodiment will be described below.

Figure 10:
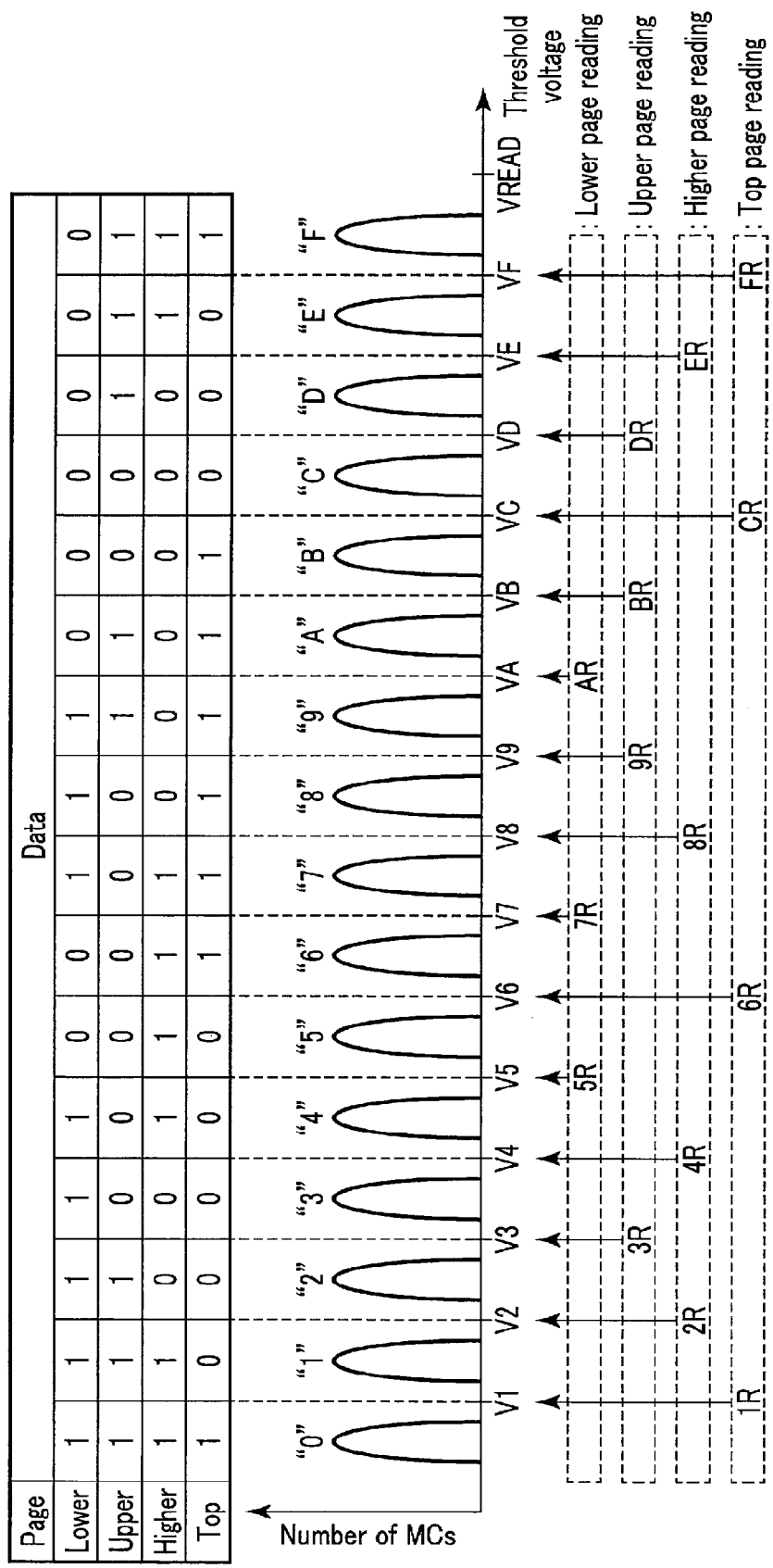
FIG. 10 is a diagram illustrating possible data, a threshold distribution, and read levels for memory cells according to a third embodiment.

3. 1 Relations Between the Held Data and Read Levels for the Memory Cell Transistors FIG. 10 is a diagram illustrating possible data, a threshold distribution, and voltages used for reading, for the memory cell transistors according to the present embodiment, and corresponds to FIG. 3 described in the first embodiment.

In the present embodiment, the relations between the "0" to "F" data that may be assumed by the memory cell transistors and the lower bit, the upper bit, the higher bit, and the top bit are as follows.

"0" data: "1111"
"1" data: "0111"
"2" data: "0011"
"3" data: "0001"
"4" data: "0101"
"5" data: "0100"
"6" data: "1100"
"7" data: "1101"
"8" data: "1001"
"9" data: "1011"
"A" data: "1010"
"B" data: "1000"
"C" data: "0000"
"D" data: "0010"
"E" data: "0110"
"F" data: "1110"

The lower page may be read using the voltages V5, V7, and VA. The upper page may be read using the voltages V3, V9, VB, and VD. The higher page may be read using the voltages V2, V4, V8, and VE. The top page may be read using the voltages V1, V6, VC, and VF.

3. 2 Reading Operation

Now, a method for reading data in the NAND flash memory 100 according to the present embodiment will be described.

First, a case of page-by-page reading will be described using FIG. 11. FIG. 11 is a timing chart illustrating how the I/O signal I/O, the ready/busy signal RBn, and the selected word line WL operate during the reading operation according to the present example.

As depicted in FIG. 11, in reading of the lower page, the voltage of the selected word line WL is sequentially stepped up to V5, V7, and VA to allow the reading operations 5R, 7R, and AR to be performed. The three reading operations establish the lower page data.

In reading of the upper page, the voltage of the selected word line WL is sequentially stepped up to V3, V9, VB, and VD to allow the reading operations 3R, 9R, BR, and DR to be performed. The four reading operations establish the upper page data.

In reading of the higher page, the voltage of the selected word line WL is sequentially stepped up to V2, V4, V8, and VE to allow the reading operations 2R, 4R, 8R, and ER to be performed. The four reading operations establish the higher page data.

In reading of the top page, the voltage of the selected word line WL is sequentially stepped up to V1, V6, VC, and VF to allow the reading operations 1R, 6R, CR, and FR to be performed. The four reading operations establish the top page data.

Also in the present example, reading using the command "31h" may be performed which is described with reference to FIG. 5 for the first embodiment.

3.3 Effects of the Present Embodiment

The configuration according to the present embodiment allows the reliability of reading operations to be improved by using the 3-4-4-4 mapping. The lower page data, included in the 4-page data, is established first at the AR, enabling the cache memory XDL to be released early.

4. Fourth Embodiment

Now, a semiconductor memory device according to a fourth embodiment will be described. The present embodiment relates to 3-4-4-4 mapping different from the 3-4-4-4 mapping in the first to third embodiments. Only differences from the first embodiment will be described below.

Figure 12:
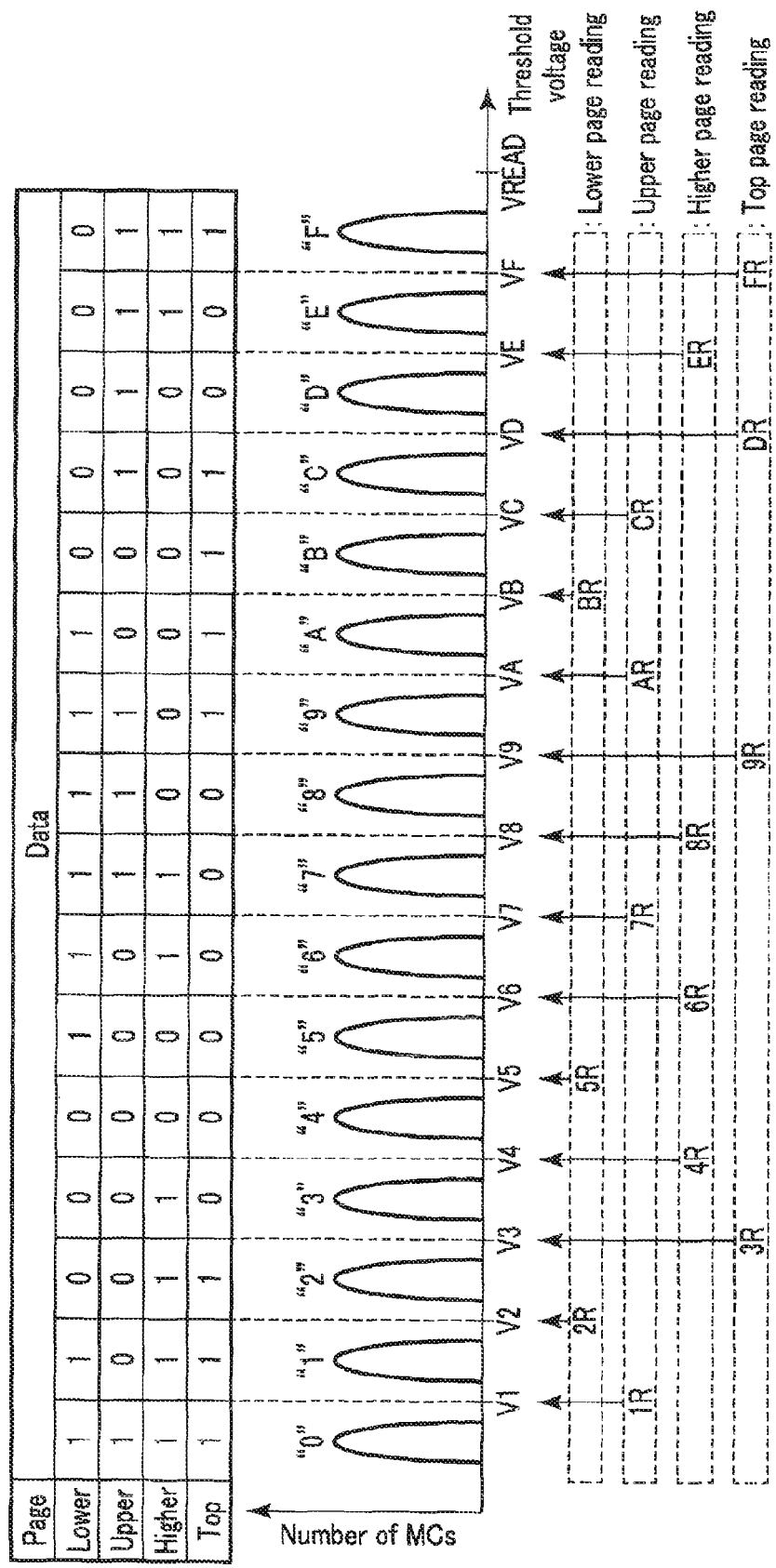
FIG. 12 is a diagram illustrating possible data, a threshold distribution, and read levels for memory cells according to a fourth embodiment.

4.1 Relations Between the Held Data and Read Levels for the Memory Cell Transistors FIG. 12 is a diagram illustrating possible data, a threshold distribution, and voltages used for reading, for the memory cell transistors according to the present embodiment, and corresponds to FIG. 3 described in the first embodiment.

In the present embodiment, the relations between the "0" to "F" data that may be assumed by the memory cell transistors and the lower bit, the upper bit, the higher bit, and the top bit are as follows.

"0" data: "1111"
"1" data: "1101"
"2" data: "1100"
"3" data: "0100"
"4" data: "0000"
"5" data: "0001"
"6" data: "0101"
"7" data: "0111"
"8" data: "0011"
"9" data: "1011"
"A" data: "1001"
"B" data: "1000"
"C" data: "1010"
"D" data: "0010"
"E" data: "0110"
"F" data: "1110"

That is, the mapping in the present example is a mirror pattern of FIG. 10 described in the first embodiment.

The lower page may be read using the voltages V2, V5, and VB. The upper page may be read using the voltages V1, V7, VA, and VC. The higher page may be read using the voltages V4, V6, V8, and VE. The top page may be read using the voltages V3, V9, VD, and VF.

4.2 Reading Operation

Now, a method for reading data in the NAND flash memory 100 according to the present embodiment will be described.

<Page-by-Page Reading>

Figure 13:
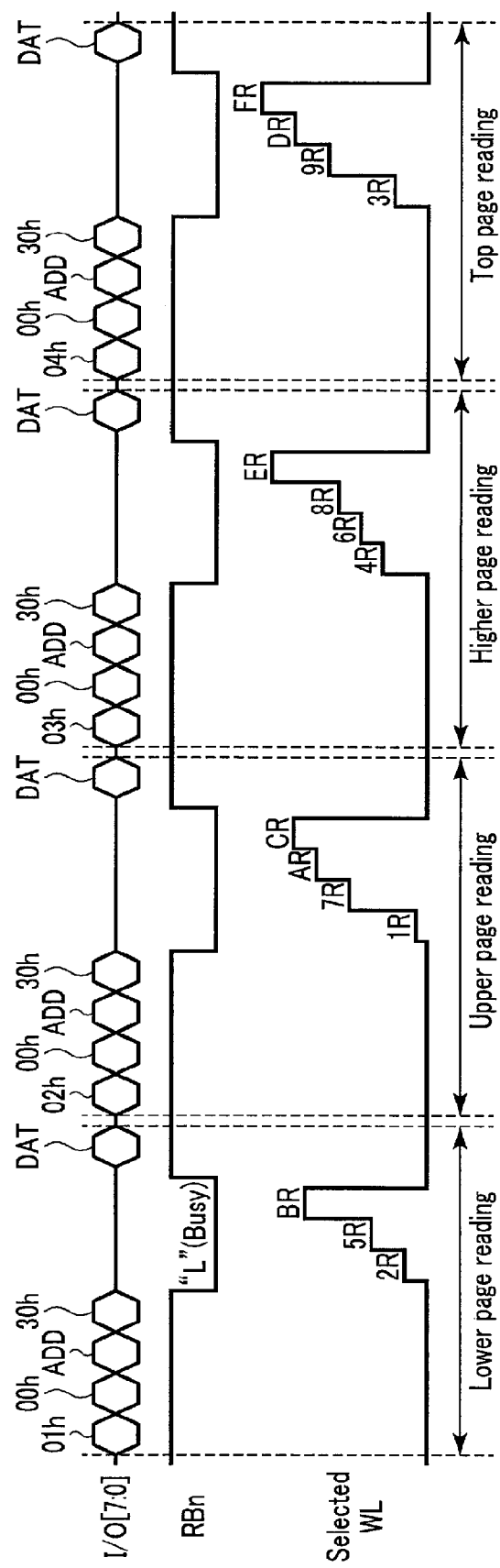
FIGS. 13 and 14 are timing charts of various signals during a reading operation according to the fourth embodiment.

First, a case of page-by-page reading will be described using FIG. 13. FIG. 13 is a timing chart illustrating how the I/O signal I/O, the ready/busy signal RBn, and the selected word line WL operate during the reading operation according to the present example.

As depicted in FIG. 13, in reading of the lower page, the voltage of the selected word line WL is sequentially stepped up to V2, V5, and VB to allow the reading operations 2R, 5R, and BR to be performed. The three reading operations establish the lower page data.

In reading of the upper page, the voltage of the selected word line WL is sequentially stepped up to V1, V7, VA, and VC to allow the reading operations 1R, 7R, AR, and CR to be performed. The four reading operations establish the upper page data.

In reading of the higher page, the voltage of the selected word line WL is sequentially stepped up to V4, V6, V8, and VE to allow the reading operations 4R, 6R, 8R, and ER to be performed. The four reading operations establish the higher page data.

In reading of the top page, the voltage of the selected word line WL is sequentially stepped up to V3, V9, VD, and VF to allow the reading operations 3R, 9R, DR, and FR to be performed. The four reading operations establish the top page data.

Also in the present example, reading using the command "31h" may be performed which is described with reference to FIG. 5 for the first embodiment.

<Sequential Reading>

Figure 14:
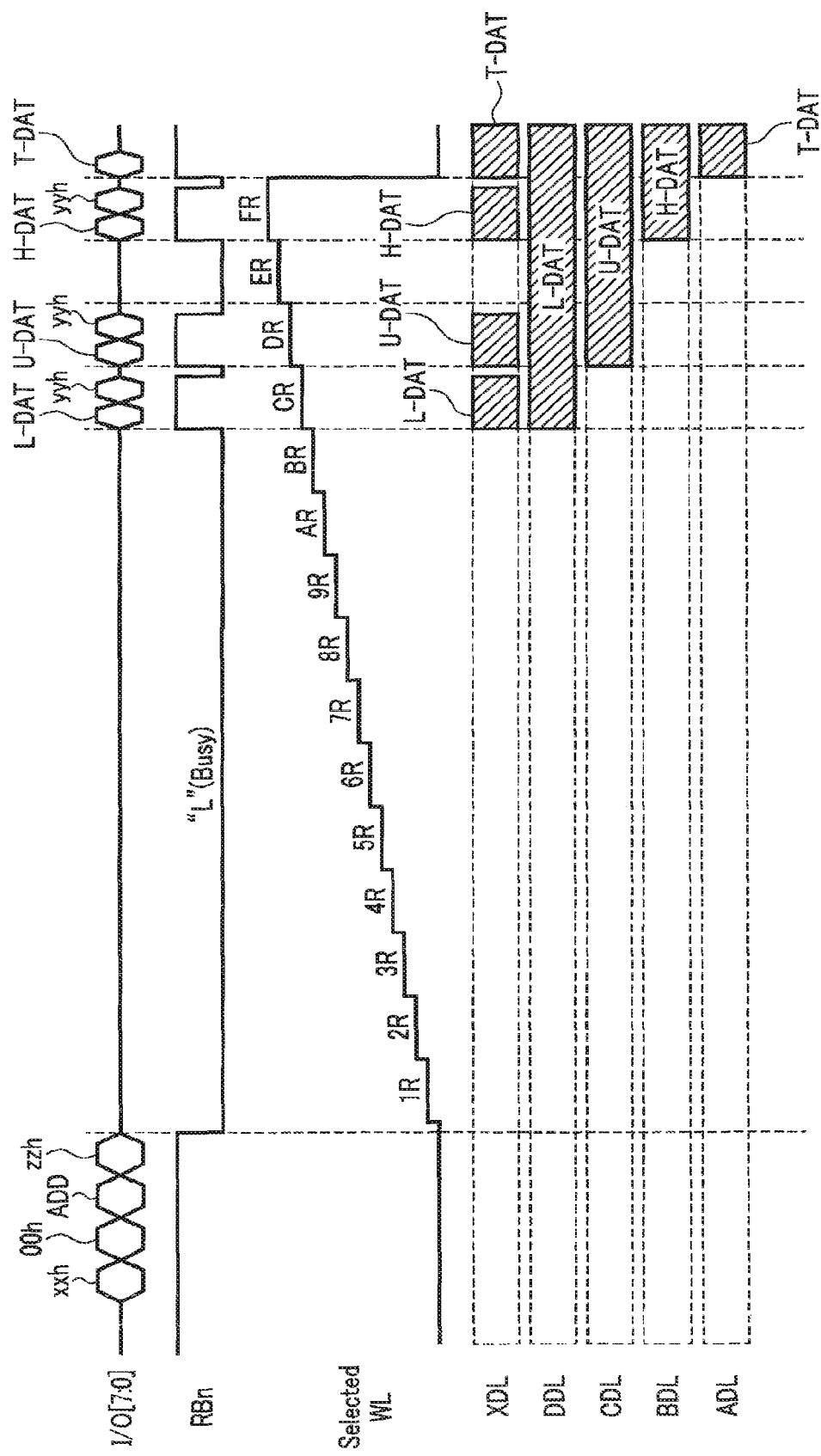

Now, a case of sequential reading will be described using FIG. 14. FIG. 14 is a timing chart illustrating how the I/O signal I/O, the ready/busy signal RBn, the selected word line WL, and the latch circuits ADL, BDL, CDL, DDL, and XDL operate during the reading operation according to the present example.

As depicted in FIG. 14, differences from FIG. 6 described in the first embodiment are that the lower page data is established when the reading operation BR is completed and that the upper page data is established when the CR is completed.

4.3 Effects of the Present Embodiment

The configuration according to the present embodiment also allows the reliability of reading operations to be improved by using the 3-4-4-4 mapping. Furthermore, as is the case with the first embodiment, different pages are assigned to the reading operations 1R and FR (in the present example, the upper page and the top page). Therefore, this also allows the reliability of reading operations to be improved.

5. Fifth Embodiment

Now, a semiconductor memory device according to a fifth embodiment will be described. The present embodiment relates to a mapping method different from the 3-4-4-4 mapping described in the first to fourth embodiments. Only differences from the first embodiment will be described below.

Figure 15:
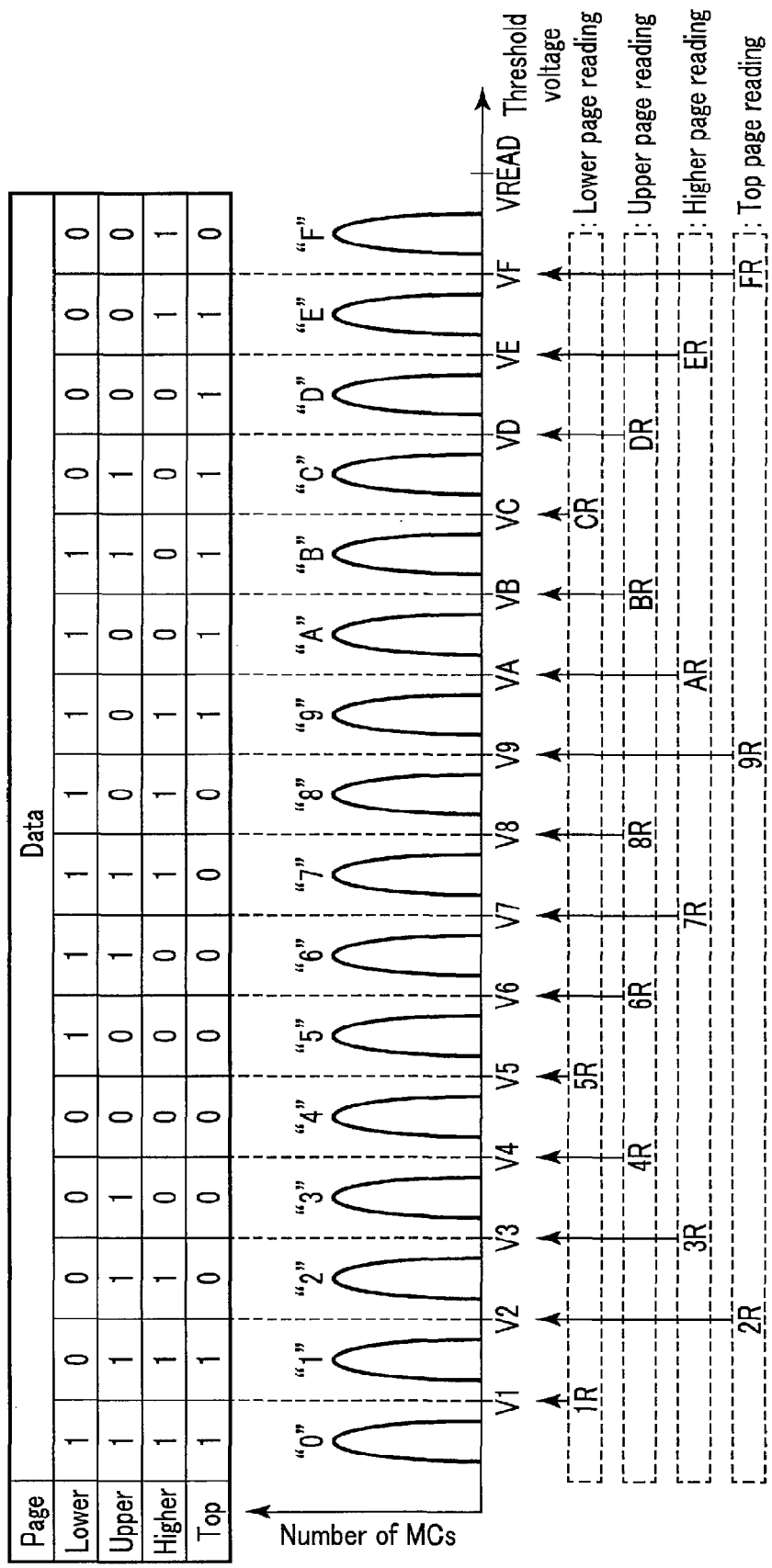
FIG. 15 is a diagram illustrating possible data, a threshold distribution, and read levels for memory cells according to a fifth embodiment.

5.1 Relations Between the Held Data and Read Levels for the Memory Cell Transistors FIG. 15 is a diagram illustrating possible data, a threshold distribution, and voltages used for reading, for the memory cell transistors according to the present embodiment, and corresponds to FIG. 3 described in the first embodiment.

In the present embodiment, the relations between the "0" to "F" data that may be assumed by the memory cell transistors and the lower bit, the upper bit, the higher bit, and the top bit are as follows.

"0" data: "1111"
"1" data: "1110"
"2" data: "0110"
"3" data: "0010"
"4" data: "0000"
"5" data: "0001"
"6" data: "0011"
"7" data: "0111"
"8" data: "0101"
"9" data: "1101"
"A" data: "1001"
"B" data: "1011"
"C" data: "1010"
"D" data: "1000"

"E" data: "1100"
"F" data: "0100"

The lower page may be read using the voltages V1, V5, and VC. The upper page may be read using the voltages V4, V6, V8, VB, and VD. The higher page may be read using the voltages V3, V7, VA, and VE. The top page may be read using the voltages V2, V9, and VF.

5. 2 Reading Operation

Now, a method for reading data in the NAND flash memory 100 according to the present embodiment will be described.

<Page-by-Page Reading>

Figure 16:
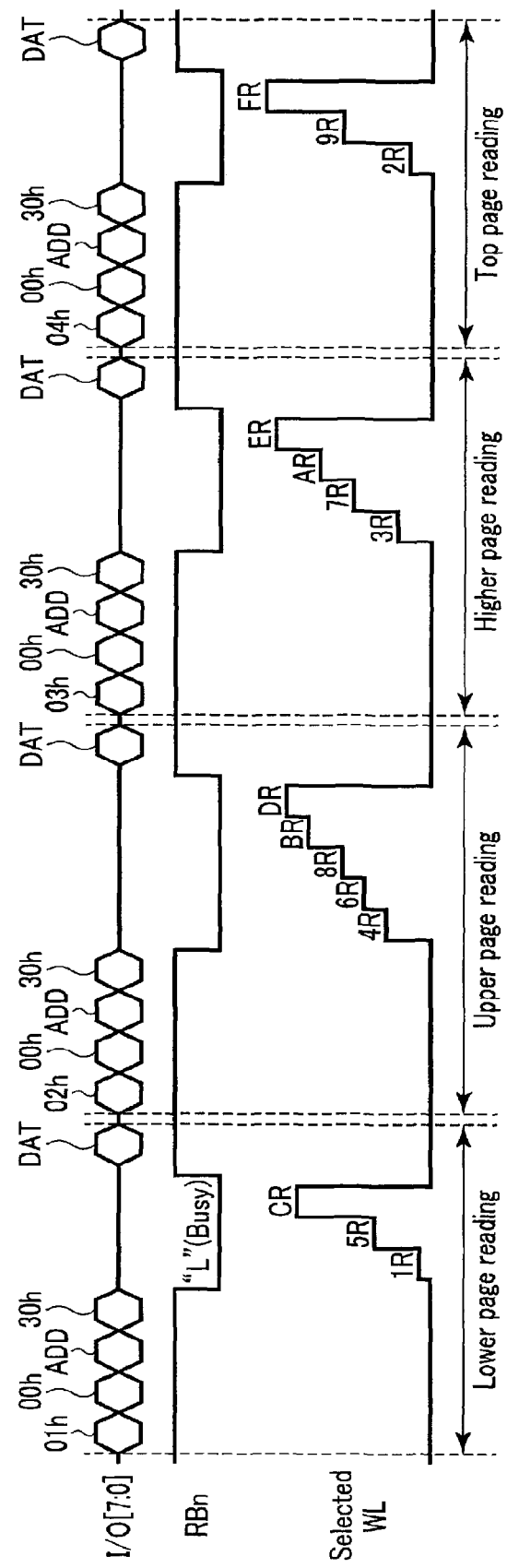
FIGS. 16 and 17 are timing charts of various signals during a reading operation according to the fifth embodiment.

First, a case of page-by-page reading will be described using FIG. 16. FIG. 16 is a timing chart illustrating how the I/O signal I/O, the ready/busy signal RBn, and the selected word line WL operate during the reading operation according to the present example.

As depicted in FIG. 16, in reading of the lower page, the voltage of the selected word line WL is sequentially stepped up to V1, V5, and VC to allow the reading operations 1R, 5R, and CR to be performed. The three reading operations establish the lower page data.

In reading of the upper page, the voltage of the selected word line WL is sequentially stepped up to V4, V6, V8, VB, and VD to allow the reading operations 4R, 6R, 8R, BR, and DR to be performed. The five reading operations establish the upper page data.

In reading of the higher page, the voltage of the selected word line WL is sequentially stepped up to V3, V7, VA, and VE to allow the reading operations 3R, 7R, AR, and ER to be performed. The four reading operations establish the higher page data.

In reading of the top page, the voltage of the selected word line WL is sequentially stepped up to V2, V9, and VF to allow the reading operations 2R, 9R, and FR to be performed. The three reading operations establish the top page data.

Also in the present example, reading using the command "31h" may be performed which is described with reference to FIG. 5 for the first embodiment.

<Sequential Reading>

Figure 17:
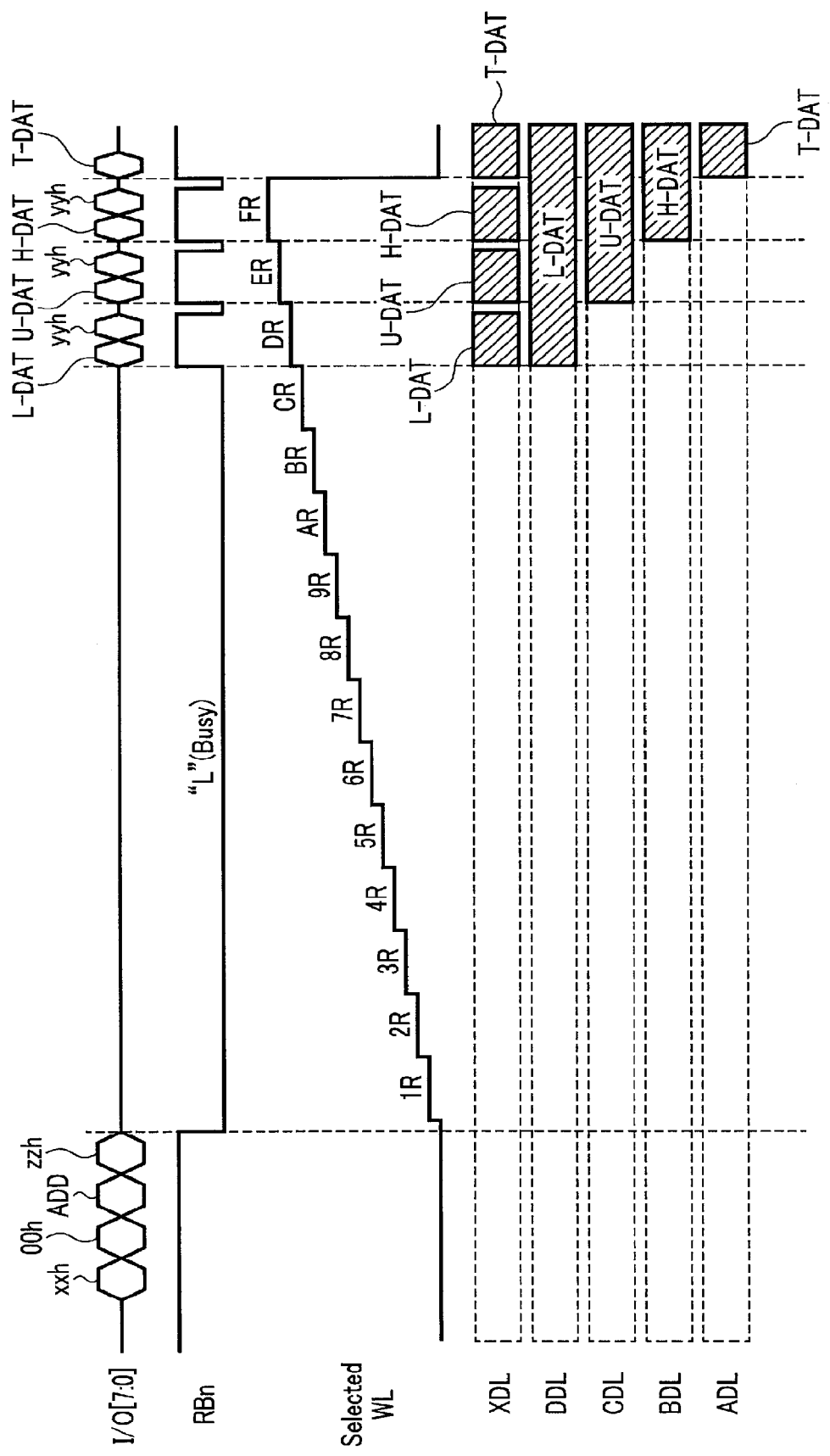

Now, a case of sequential reading will be described using FIG. 17. FIG. 17 is a timing chart illustrating how the I/O signal I/O, the ready/busy signal RBn, the selected word line WL, and the latch circuits ADL, BDL, CDL, DDL, and XDL operate during the reading operation according to the present example.

As depicted in FIG. 17, the lower page data, the upper page data, the higher page data, and the top page data are established when the CR, the DR, the ER, and the FR, respectively, are completed.

5. 3 Effects of the Present Embodiment

In the configuration according to the present embodiment, the NAND flash memory that can hold 4-bit data (16-level data) establishes the lower page data by three reading operations, establishes the upper page data by five reading operations, establishes the higher page data by four reading operations, and establishes the top page data by three reading operations. Such a method is hereinafter referred to as "3-3-4-5 mapping".

The 3-3-4-5 mapping allows the 1R and the FR to be assigned to different page reading operations. Specifically, in the present example, the 1R is assigned to the lower page, and the FR is assigned to the top page. The numbers of times that the lower page and the top page are read are each three. When the rate of occurrence of errors during the 1R is similar to the rate of occurrence of errors during the FR and the rates are relatively high, concentration of the errors on a particular page can be suppressed by assigning the 1R and the FR to pages with a small numbers of reading operations. Such mapping is enabled because establishment of any page is allowed to need five reading operations. However, the reliability of reading operations can be restrained from bring degraded by assigning a reading operation with a relatively low rate of occurrence of errors to the five reading operations.

6. Sixth Embodiment

Now, a semiconductor memory device according to a sixth embodiment will be described. Like the fifth embodiment, the present embodiment relates to a mapping method different from the 3-4-4-4 mapping described in the first to fourth embodiments. Only differences from the fifth embodiment will be described below.

Figure 18:
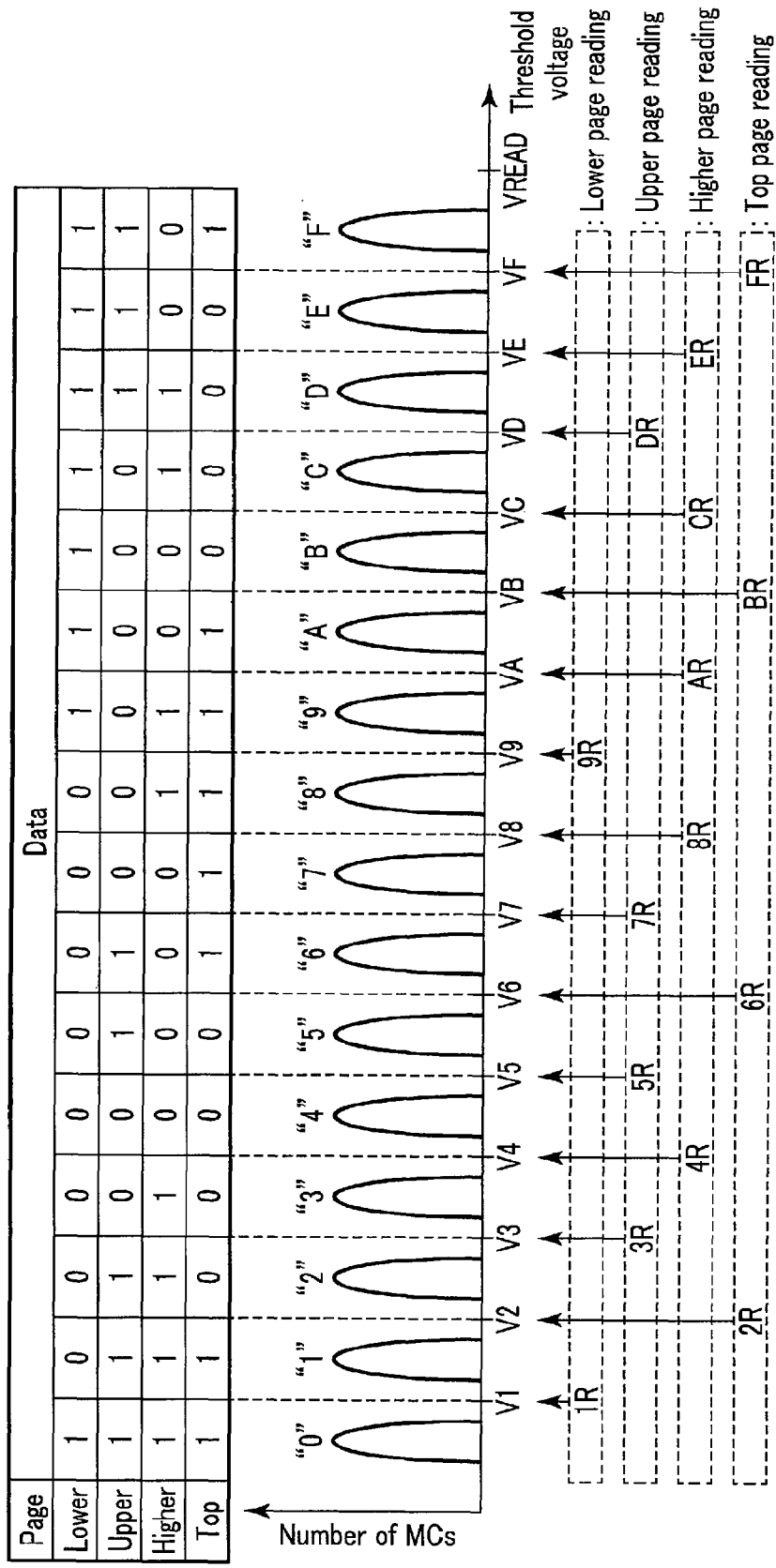
FIG. 18 is a diagram illustrating possible data, a threshold distribution, and read levels for memory cells according to a sixth embodiment.

6. 1 Relations Between the Held Data and Read Levels for the Memory Cell Transistors FIG. 18 is a diagram illustrating possible data, a threshold distribution, and voltages used for reading, for the memory cell transistors according to the present embodiment, and corresponds to FIG. 3 described in the first embodiment.

In the present embodiment, the relations between the "0" to "F" data that may be assumed by the memory cell transistors and the lower bit, the upper bit, the higher bit, and the top bit are as follows.

"0" data: "1111"
"1" data: "1110"
"2" data: "0110"
"3" data: "0100"
"4" data: "0000"
"5" data: "0010"
"6" data: "1010"
"7" data: "1000"
"8" data: "1100"
"9" data: "1101"
"A" data: "1001"
"B" data: "0001"
"C" data: "0101"
"D" data: "0111"
"E" data: "0011"
"F" data: "1011"

The lower page may be read using the voltages V1 and V9. The upper page may be read using the voltages V3, V5, V7, and VD. The higher page may be read using the voltages V4, V8, VA, VC, and VE. The top page may be read using the voltages V2, V9, VB, and VF.

6. 2 Reading Operation

Now, a method for reading data in the NAND flash memory 100 according to the present embodiment will be described.

<Page-by-Page Reading>

Figure 19:
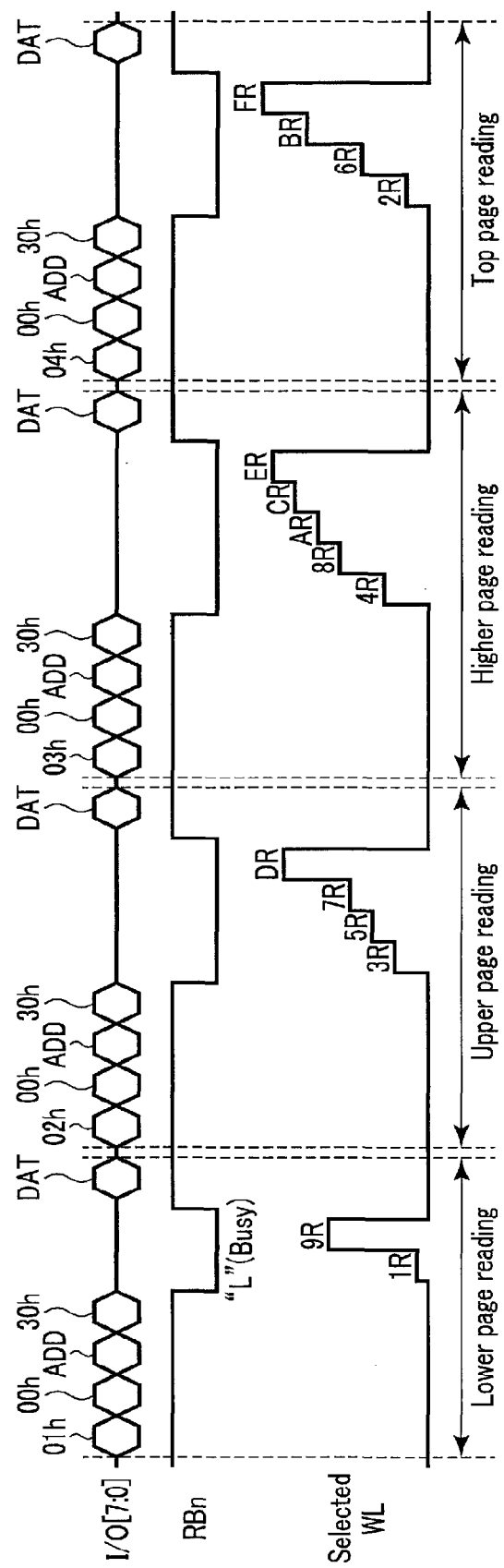
FIGS. 19 and 20 are timing charts of various signals during a reading operation according to the sixth embodiment.

First, a case of page-by-page reading will be described using FIG. 19. FIG. 19 is a timing chart illustrating how the I/O signal I/O, the ready/busy signal RBn, and the selected word line WL operate during the reading operation according to the present example.

As depicted in FIG. 19, in reading of the lower page, the voltage of the selected word line WL is sequentially stepped up to V1 and V9 to allow the reading operations 1R and 9R to be performed. The two reading operations establish the lower page data.

In reading of the upper page, the voltage of the selected word line WL is sequentially stepped up to V3, V5, V7, and VD to allow the reading operations 3R, 5R, 7R, and DR to be performed. The four reading operations establish the upper page data.

In reading of the higher page, the voltage of the selected word line WL is sequentially stepped up to V4, V8, VA, VC, and VE to allow the reading operations 4R, 8R, AR, CR, and ER to be performed. The five reading operations establish the higher page data.

In reading of the top page, the voltage of the selected word line WL is sequentially stepped up to V2, V6, VB, and VF to allow the reading operations 2R, 6R, BR, and FR to be performed. The four reading operations establish the top page data.

Also in the present example, reading using the command "31h" may be performed which is described with reference to FIG. 5 for the first embodiment.

<Sequential Reading>

Figure 20:
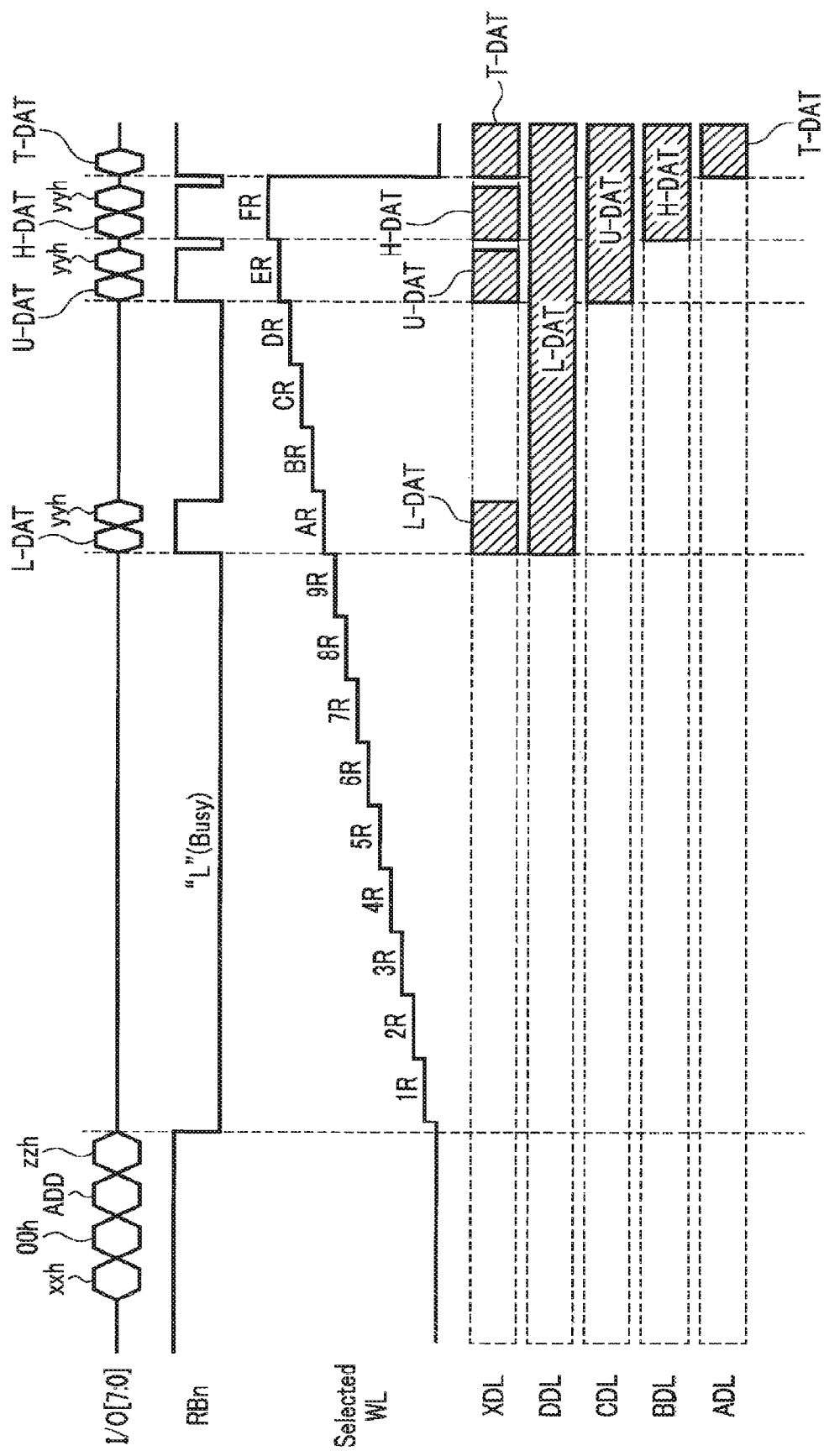

Now, a case of sequential reading will be described using FIG. 20. FIG. 20 is a timing chart illustrating how the I/O signal I/O, the ready/busy signal RBn, the selected word line WL, and the latch circuits ADL, BDL, CDL, DDL, and XDL operate during the reading operation according to the present example.

As depicted in FIG. 20, a difference from FIG. 17 described in the fifth embodiment is that the lower page data is established when the 9R is completed.

6. 3 Effects of the Present Embodiment

In the configuration according to the present embodiment, the NAND flash memory that can hold 4-bit data (16-level data) establishes the lower page data by two reading operations, establishes the upper page data by four reading operations, establishes the higher page data by five reading operations, and establishes the top page data by four reading operations. Such a method is hereinafter referred to as "2-4-4-5 mapping".

In the 2-4-4-5 mapping according to the present example, the 1R is assigned to the lower page for which the data is established by two reading operations. Therefore, even if the reliability of the 1R is substantially low, concentration of errors on a particular page can be suppressed.

Furthermore, in the present example, the reading operation 9R establishes the first page data (lower page data). Therefore, read latency can be reduced.

7. Seventh Embodiment

Now, a semiconductor memory device according to a seventh embodiment will be described. Like the sixth embodiment, the present embodiment uses the 2-4-4-5 mapping. Only differences from the sixth embodiment will be described below.

7. 1 Relations Between the Held Data and Read Levels for the Memory Cell Transistors FIG. 21 is a diagram illustrating possible data, a threshold distribution, and voltages used for reading, for the memory cell transistors according to the present embodiment, and corresponds to FIG. 3 described in the first embodiment.

In the present embodiment, the relations between the "0" to "F" data that may be assumed by the memory cell transistors and the lower bit, the upper bit, the higher bit, and the top bit are as follows.

"0" data: "1111"
"1" data: "1110"
"2" data: "1100"
"3" data: "1101"
"4" data: "1001"
"5" data: "1000"
"6" data: "1010"
"7" data: "0010"
"8" data: "0110"
"9" data: "0100"
"A" data: "0000"
"B" data: "0001"
"C" data: "0101"
"D" data: "0111"
"E" data: "0011"
"F" data: "1011"

The lower page may be read using the voltages V1, V3, V5, and VB. The upper page may be read using the voltages V2, V6, V9, and VD. The higher page may be read using the voltages V4, V8, VA, VC, and VE. The top page may be read using the voltages V7 and VF.

7. 2 Reading Operation

Now, a method for reading data in the NAND flash memory 100 according to the present embodiment will be described.

First, a case of page-by-page reading will be described using FIG. 22. FIG. 22 is a timing chart illustrating how the I/O signal I/O, the ready/busy signal RBn, and the selected word line WL operate during the reading operation according to the present example.

As depicted in FIG. 22, in reading of the lower page, the voltage of the selected word line WL is sequentially stepped up to V1, V3, V5, and VB to allow the reading operations 1R, 3R, 5R, and BR to be performed. The four reading operations establish the lower page data.

In reading of the upper page, the voltage of the selected word line WL is sequentially stepped up to V2, V6, V9, and VD to allow the reading operations 2R, 6R, 9R, and DR to be performed. The four reading operations establish the upper page data.

In reading of the higher page, the voltage of the selected word line WL is sequentially stepped up to V4, V8, VA, VC, and VE to allow the reading operations 4R, 8R, AR, CR, and ER to be performed. The five reading operations establish the higher page data.

In reading of the top page, the voltage of the selected word line WL is sequentially stepped up to V7 and VF to allow the reading operations 7R and FR to be performed. The four reading operations establish the top page data.

Also in the present example, reading using the command "31h" may be performed which is described with reference to FIG. 5 for the first embodiment.

A case of sequential reading is similar the case of sequential reading in FIG. 14 described in the fourth embodiment.

7. 3 Effects of the Present Embodiment

In the configuration according to the present embodiment, in the 2-4-4-5 mapping described in the sixth embodiment, the FR is assigned to the top page for which the data is established by two reading operations. Therefore, even if the reliability of the FR is substantially low, concentration of errors on a particular page can be suppressed.

8. Eighth Embodiment

Now, a semiconductor memory device according to an eighth embodiment will be described. Like the first to fourth embodiments, the present embodiment relates to mapping that uses the 3-4-4-4 mapping as is the case with the first to fourth embodiments and in which a page involving the reading operations 1R and FR is different from a page involving the reading operations 2R and ER. Only differences from the first embodiment will be described below.

Figure 23:
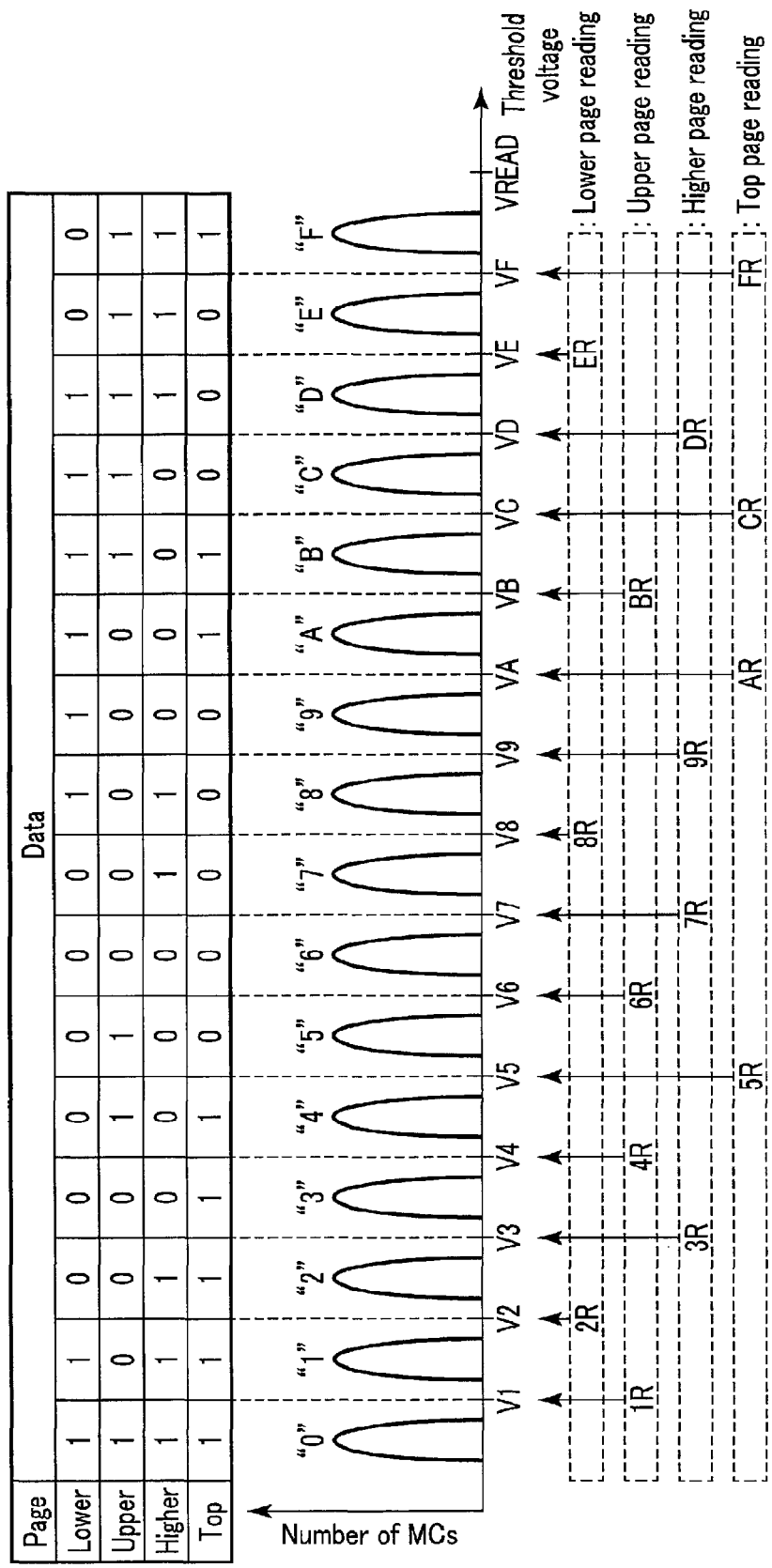
FIG. 23 is a diagram illustrating possible data, a threshold distribution, and read levels for memory cells according to an eighth embodiment.

8. 1 Relations Between the Held Data and Read Levels for the Memory Cell Transistors FIG. 23 is a diagram illustrating possible data, a threshold distribution, and voltages used for reading, for the memory cell transistors according to the present embodiment, and corresponds to FIG. 3 described in the first embodiment.

In the present embodiment, the relations between the "0" to "F" data that may be assumed by the memory cell transistors and the lower bit, the upper bit, the higher bit, and the top bit are as follows.

"0" data: "1111"
"1" data: "1101"
"2" data: "1100"
"3" data: "1000"
"4" data: "1010"
"5" data: "0010"
"6" data: "0000"
"7" data: "0100"
"8" data: "0101"
"9" data: "0001"
"A" data: "1001"
"B" data: "1011"
"C" data: "0011"
"D" data: "0111"
"E" data: "0110"
"F" data: "1110"

The lower page may be read using the voltages V2, V8, and VE. The upper page may be read using the voltages V1, V4, V6, and VB. The higher page may be read using the voltages V3, V7, V9, and VD. The top page may be read using the voltages V5, VA, VC, and VF.

8. 2 Reading Operation

Now, a method for reading data in the NAND flash memory 100 according to the present embodiment will be described.

<Page-by-Page Reading>

First, a case of page-by-page reading will be described using FIG. 24. FIG. 24 is a timing chart illustrating how the I/O signal I/O, the ready/busy signal RBn, and the selected word line WL operate during the reading operation according to the present example.

As depicted in FIG. 24, in reading of the lower page, the voltage of the selected word line WL is sequentially stepped up to V2, V8, and VE to allow the reading operations 2R, 8R, and ER to be performed. The three reading operations establish the lower page data.

In reading of the upper page, the voltage of the selected word line WL is sequentially stepped up to V1, V4, V6, and VB to allow the reading operations 1R, 4R, 6R, and BR to be performed. The four reading operations establish the upper page data.

In reading of the higher page, the voltage of the selected word line WL is sequentially stepped up to V3, V7, V9, and VD to allow the reading operations 3R, 7R, 9R, and DR to be performed. The four reading operations establish the higher page data.

In reading of the top page, the voltage of the selected word line WL is sequentially stepped up to V5, VA, VC, and VF to allow the reading operations 5R, AR, CR, and FR to be performed. The four reading operations establish the top page data.

Also in the present example, reading using the command "31h" may be performed which is described with reference to FIG. 5 for the first embodiment.

<Sequential Reading>

Figure 25:
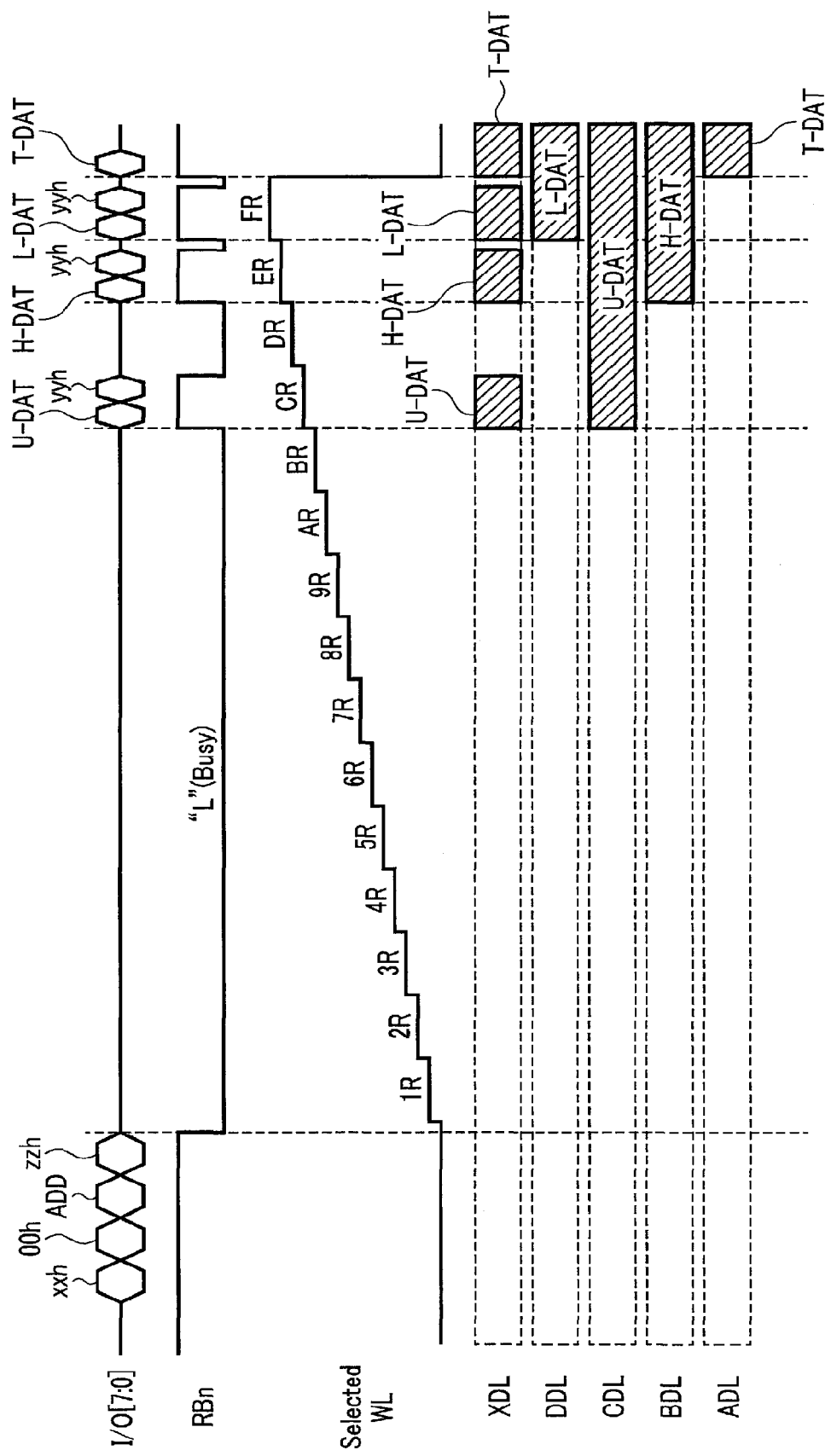

Now, a case of sequential reading will be described using FIG. 25. FIG. 25 is a timing chart illustrating how the I/O signal I/O, the ready/busy signal RBn, the selected word line WL, and the latch circuits ADL, BDL, CDL, DDL, and XDL operate during the reading operation according to the present example.

As depicted in FIG. 25, unlike in FIG. 6 described in the first embodiment, first, the upper page data is established when the BR is completed, enabling the upper page data to be output to the controller first. Then, the higher page data is established when the DR is completed. Thereafter, the lower page data and the top page data are established when the ER and the FR, respectively, are completed.

8. 3 Effects of the Present Embodiment

In the configuration according to the present embodiment, the reading operations 1R and FR are assigned to the upper page data and the top page data, respectively. The reading operations 2R and ER are assigned to a page different from the upper page and the top page. The 2R and the ER are considered to be most likely to suffer errors next to the 1R and the FR, and thus, the reliability of reading can be improved by assigning the 2R and the ER to a page different from the page to which the 1R and the FR are assigned.

The upper page data, included in the 4-page data, is established first during the BR, enabling the cache memory XDL to be released early.

9. Ninth Embodiment

Now, a semiconductor memory device according to a ninth embodiment will be described. The present embodiment corresponds to the eighth embodiment in which the relations between the 16-level data and the read levels are modified. Only differences from the eighth embodiment will be described below.

Figure 26:
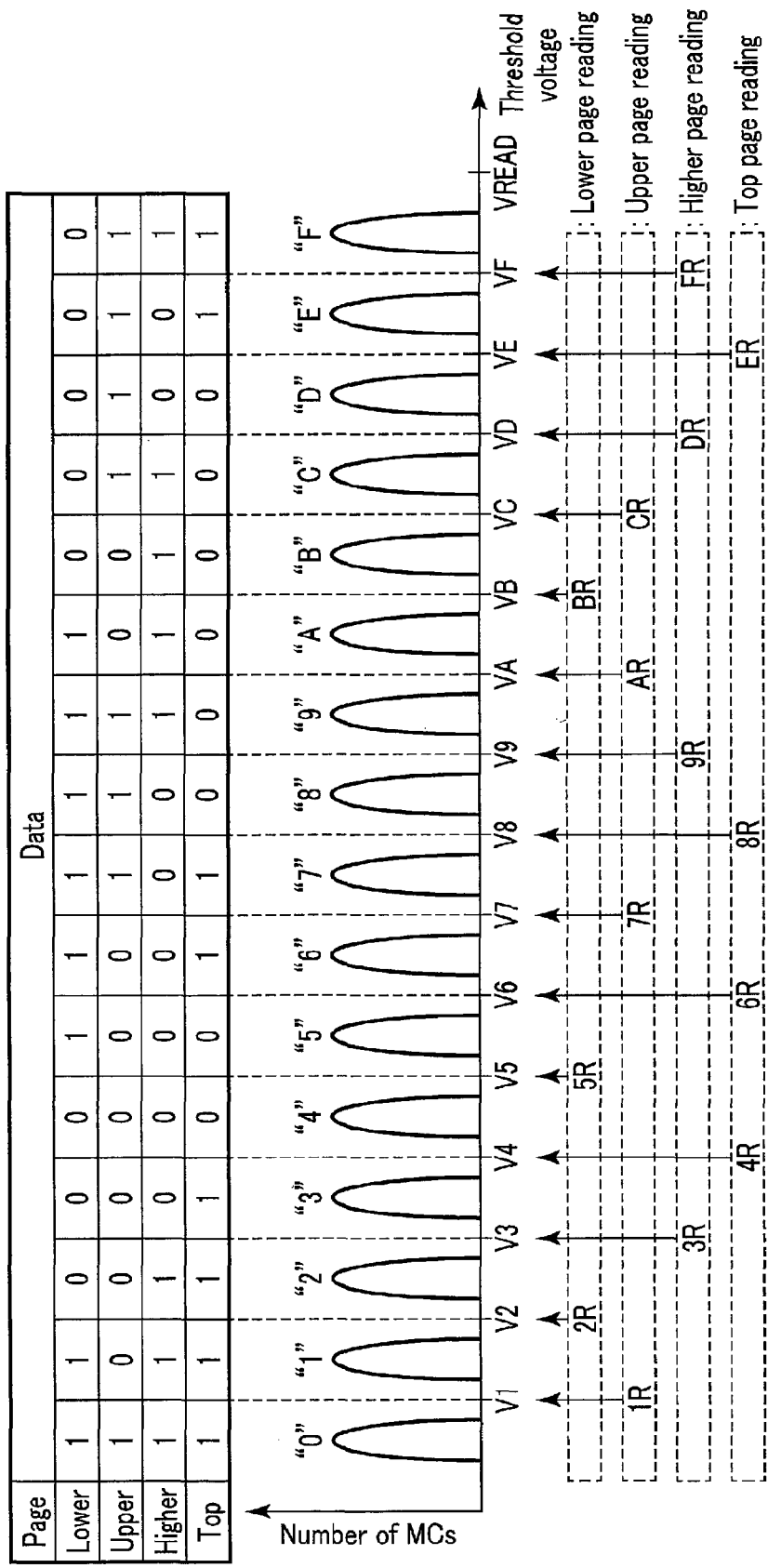
FIG. 26 is a diagram illustrating possible data, a threshold distribution, and read levels for memory cells according to a ninth embodiment.

9. 1 Relations Between the Held Data and Read Levels for the Memory Cell Transistors FIG. 26 is a diagram illustrating possible data, a threshold distribution, and voltages used for reading, for the memory cell transistors according to the present embodiment, and corresponds to FIG. 3 described in the first embodiment.

In the present embodiment, the relations between the "0" to "F" data that may be assumed by the memory cell transistors and the lower bit, the upper bit, the higher bit, and the top bit are as follows.

"0" data: "1111"
"1" data: "1101"
"2" data: "1100"
"3" data: "1000"
"4" data: "0000"
"5" data: "0001"
"6" data: "1001"
"7" data: "1011"
"8" data: "0011"
"9" data: "0111"
"A" data: "0101"
"B" data: "0100"
"C" data: "0110"
"D" data: "0010"
"E" data: "1010"
"F" data: "1110"

The lower page may be read using the voltages V2, V5, and VB. The upper page may be read using the voltages V1, V7, VA, and VC. The higher page may be read using the voltages V3, V9, VD, and VF. The top page may be read using the voltages V4, V6, V8, and VE.

9. 2 Reading Operation

Now, a method for reading data in the NAND flash memory 100 according to the present embodiment will be described.

<Page-by-Page Reading>

Figure 27:
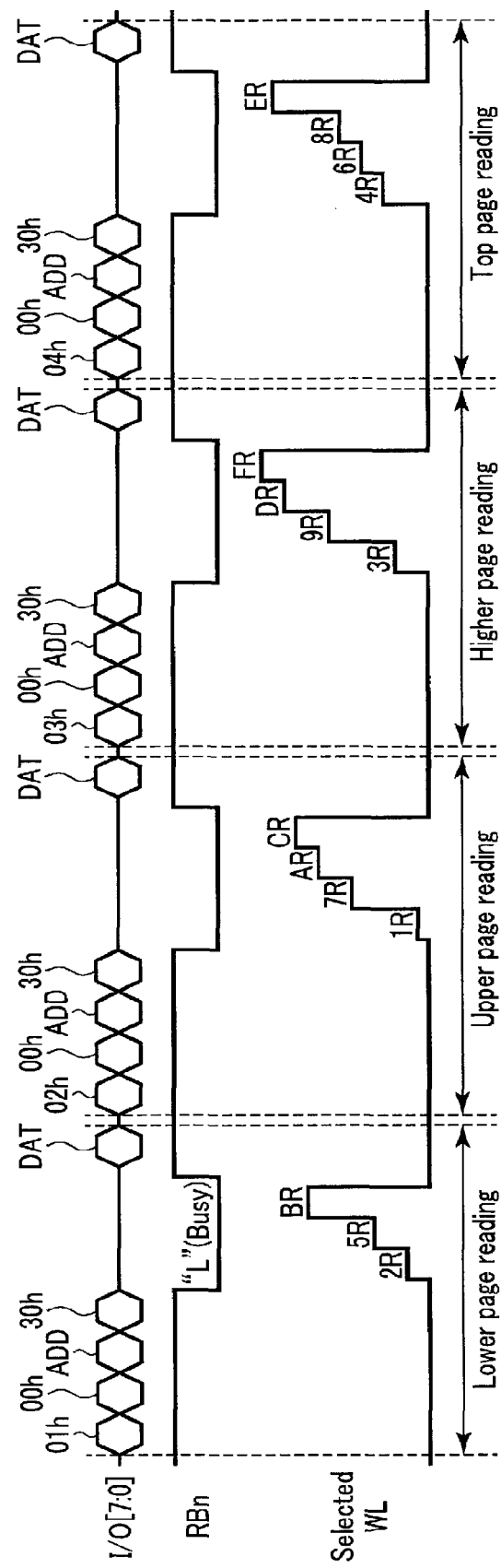
FIGS. 27 and 28 are timing charts of various signals during a reading operation according to the ninth embodiment.

First, a case of page-by-page reading will be described using FIG. 27. FIG. 27 is a timing chart illustrating how the I/O signal I/O, the ready/busy signal RBn, and the selected word line WL operate during the reading operation according to the present example.

As depicted in FIG. 27, in reading of the lower page, the voltage of the selected word line WL is sequentially stepped up to V2, V5, and VB to allow the reading operations 2R, 5R, and BR to be performed. The three reading operations establish the lower page data.

In reading of the upper page, the voltage of the selected word line WL is sequentially stepped up to V1, V7, VA, and VC to allow the reading operations 1R, 7R, AR, and CR to be performed. The four reading operations establish the upper page data.

In reading of the higher page, the voltage of the selected word line WL is sequentially stepped up to V3, V9, VD, and VF to allow the reading operations 3R, 9R, DR, and FR to be performed. The four reading operations establish the higher page data.

In reading of the top page, the voltage of the selected word line WL is sequentially stepped up to V4, V6, V8, and VE to allow the reading operations 4R, 6R, 8R, and ER to be performed. The four reading operations establish the top page data.

Also in the present example, reading using the command "31h" may be performed which is described with reference to FIG. 5 for the first embodiment.

<Sequential Reading>

Figure 28:
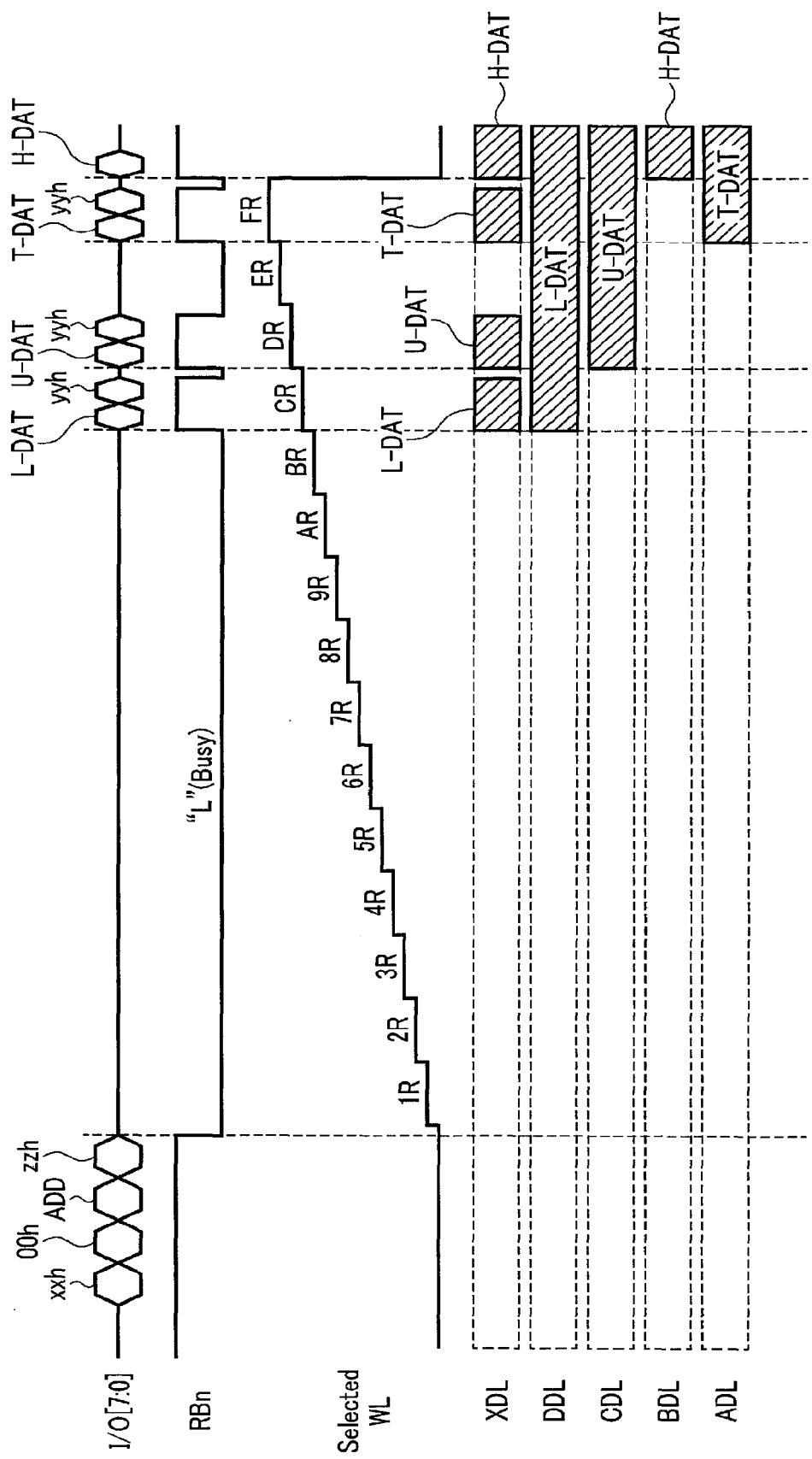

Now, a case of sequential reading will be described using FIG. 28. FIG. 28 is a timing chart illustrating how the I/O signal I/O, the ready/busy signal RBn, the selected word line WL, and the latch circuits ADL, BDL, CDL, DDL, and XDL operate during the reading operation according to the present example.

As depicted in FIG. 28, unlike in FIG. 25 described in the eighth embodiment, first, the lower page data is established when the BR is completed, enabling the lower page data to be output to the controller first. Then, the upper page data is established when the DR is completed. Thereafter, the top page data and the higher page data are established when the ER and the FR, respectively, are completed.

9. 3 Effects of the Present Embodiment

In the configuration according to the present embodiment, the reading operations 1R, 2R, ER, and FR are assigned to different pages. Consequently, the reliability of reading can further be improved. Furthermore, in the present embodiment, the 2R is assigned to a page for which the data is established by three reading operations. Therefore, the present embodiment is effective when errors are more likely to occur during the 2R than during the ER.

The lower page data, included in the 4-page data, is established first during the BR, enabling the cache memory XDL to be released early.

10. Tenth Embodiment

Now, a semiconductor memory device according to a tenth embodiment will be described. The present embodiment corresponds to the ninth embodiment in which the ER is assigned to a page for which the data is established by three reading operations. Only differences from the ninth embodiment will be described below.

Figure 29:
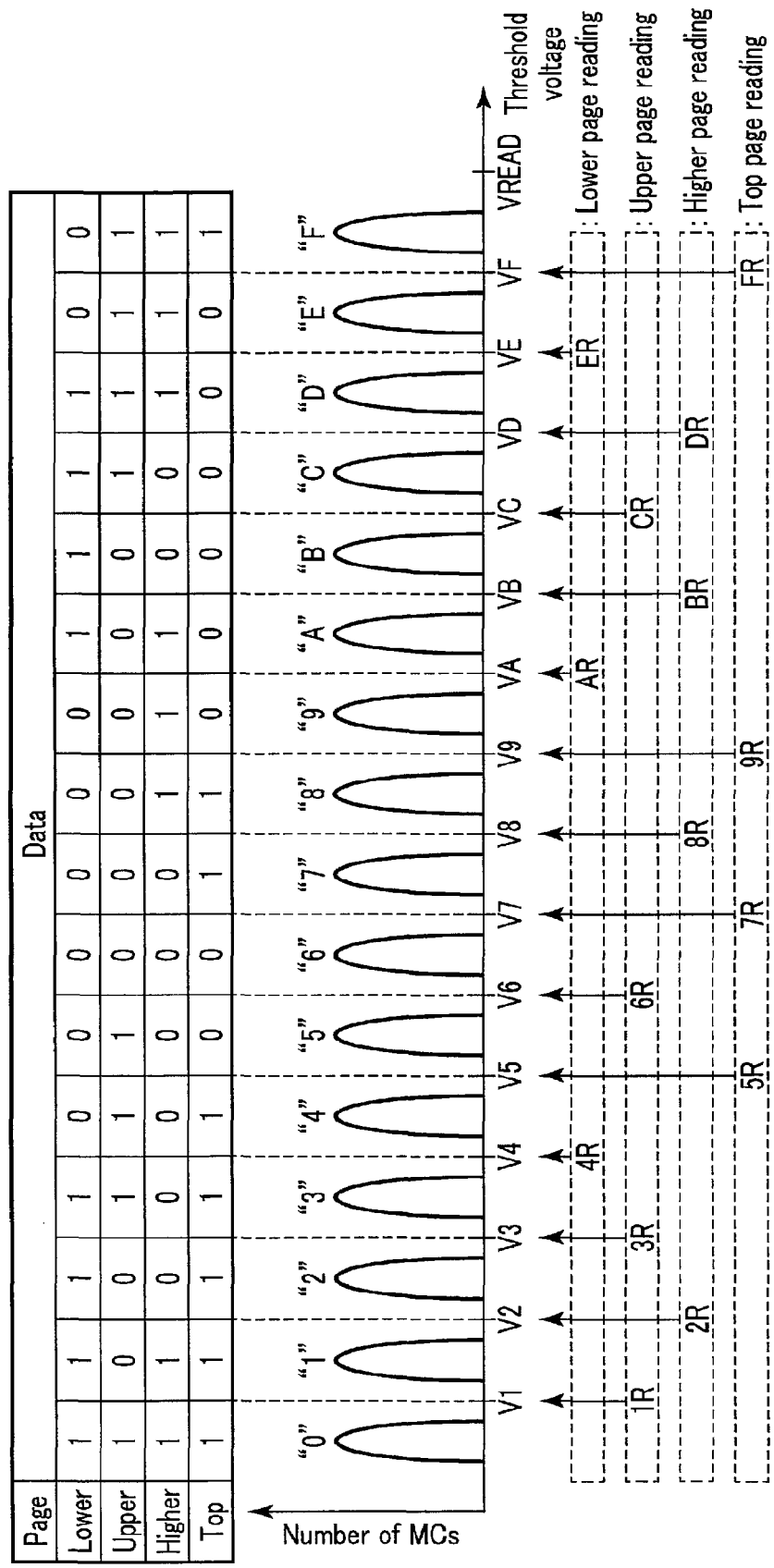
FIG. 29 is a diagram illustrating possible data, a threshold distribution, and read levels for memory cells according to a tenth embodiment.

10. 1 Relations Between the Held Data and Read Levels for the Memory Cell Transistors FIG. 29 is a diagram illustrating possible data, a threshold distribution, and voltages used for reading, for the memory cell transistors according to the present embodiment, and corresponds to FIG. 3 described in the first embodiment.

In the present embodiment, the relations between the "0" to "F" data that may be assumed by the memory cell transistors and the lower bit, the upper bit, the higher bit, and the top bit are as follows.

"0" data: "1111"
"1" data: "1101"
"2" data: "1001"
"3" data: "1011"
"4" data: "1010"
"5" data: "0010"
"6" data: "0000"
"7" data: "1000"
"8" data: "1100"
"9" data: "0100"
"A" data: "0101"
"B" data: "0001"
"C" data: "0011"
"D" data: "0111"
"E" data: "0110"
"F" data: "1110"

The lower page may be read using the voltages V4, VA, and VE. The upper page may be read using the voltages V1, V3, V6, and VC. The higher page may be read using the voltages V2, V8, VB, and VD. The top page may be read using the voltages V5, V7, V9, and VF.

10. 2 Reading Operation

Now, a method for reading data in the NAND flash memory 100 according to the present embodiment will be described.

<Page-by-Page Reading>

First, a case of page-by-page reading will be described using FIG. 30. FIG. 30 is a timing chart illustrating how the I/O signal I/O, the ready/busy signal RBn, and the selected word line WL operate during the reading operation according to the present example.

As depicted in FIG. 30, in reading of the lower page, the voltage of the selected word line WL is sequentially stepped up to V4, VA, and VE to allow the reading operations 4R, AR, and ER to be performed. The three reading operations establish the lower page data.

In reading of the upper page, the voltage of the selected word line WL is sequentially stepped up to V1, V3, V6, and VC to allow the reading operations 1R, 3R, 6R, and CR to be performed. The four reading operations establish the upper page data.

In reading of the higher page, the voltage of the selected word line WL is sequentially stepped up to V2, V8, VB, and VD to allow the reading operations 2R, 8R, BR, and DR to be performed. The four reading operations establish the higher page data.

In reading of the top page, the voltage of the selected word line WL is sequentially stepped up to V5, V7, V9, and VF to allow the reading operations 5R, 7R, 9R, and FR to be performed. The four reading operations establish the top page data.

Also in the present example, reading using the command "31h" may be performed which is described with reference to FIG. 5 for the first embodiment.

<Sequential Reading>

Figure 31:
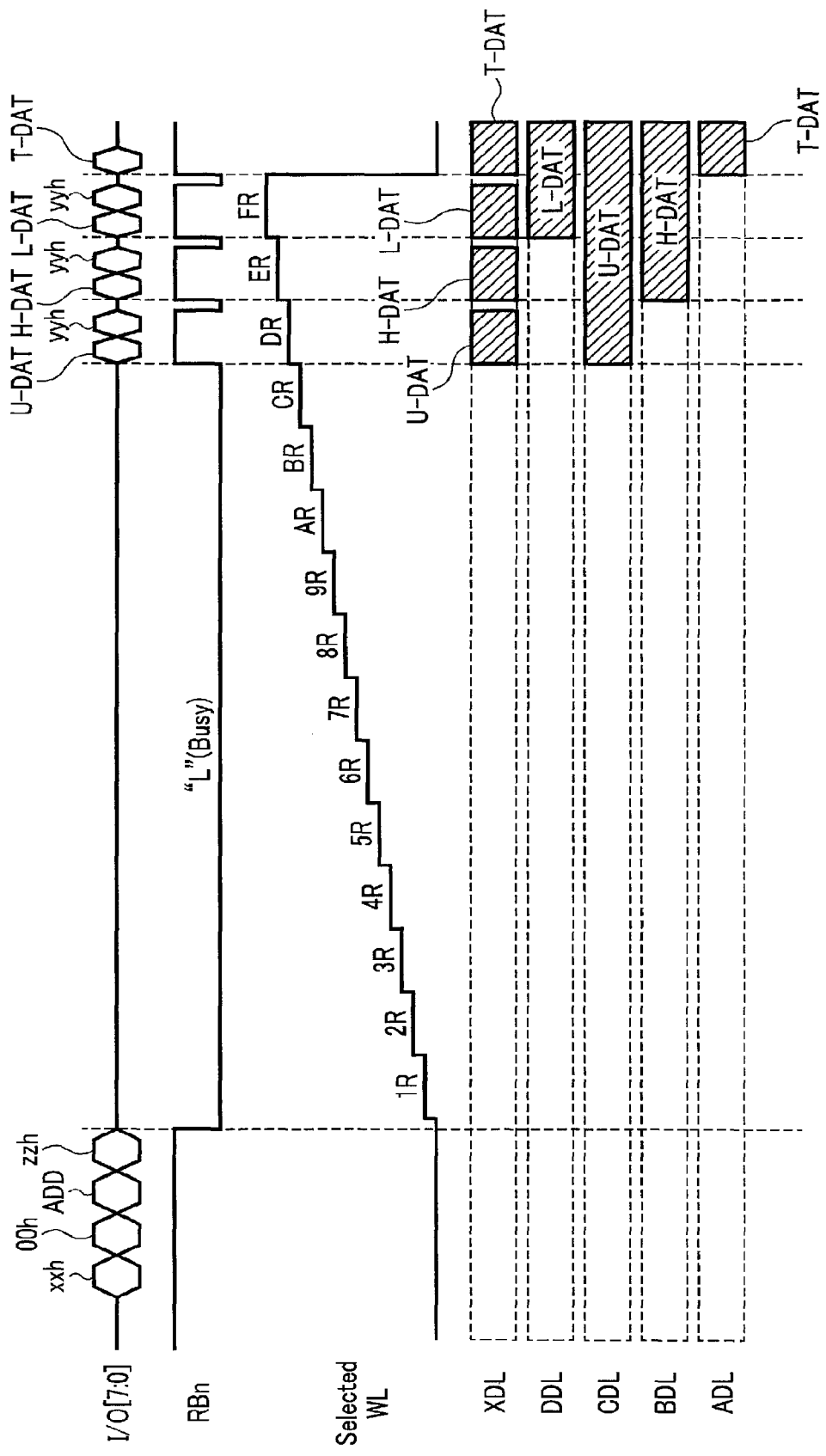

Now, a case of sequential reading will be described using FIG. 31. FIG. 31 is a timing chart illustrating how the I/O signal I/O, the ready/busy signal RBn, the selected word line WL, and the latch circuits ADL, BDL, CDL, DDL, and XDL operate during the reading operation according to the present example.

As depicted in FIG. 31, in the present embodiment, the upper page data is established when the CR is completed. The sequential reading in the present embodiment is otherwise similar to the sequential reading illustrated in FIG. 25 described in the eighth embodiment.

10. 3 Effects of the Present Embodiment

The configuration according to the present embodiment is effective when the errors are more likely to occur during the ER than during the 2R in contrast to the configuration according to the ninth embodiment.

11. Eleventh Embodiment

Now, a semiconductor memory device according to an eleventh embodiment will be described. The present embodiment relates to a modification of the 3-4-4-4 mapping described in the first to fourth embodiments and the eighth to tenth embodiments.

FIGS. 32 to 44 are diagrams illustrating possible data and read levels for the memory cell transistors according to the present example, and corresponds to the FIG. 3 described in the first embodiment and from which the illustration of the threshold distribution is omitted.

In an example in FIG. 32, the 1R and the FR are assigned to different pages, and this is preferable in view of the reliability of reading. Furthermore, the cache memory is released at the AR, and the present embodiment is also excellent in latency.

FIGS. 33 and 34 depict patterns for different assignments with respect to FIG. 26 described in the ninth embodiment. In any of the mappings, the 1R and the FR are assigned to different pages, and the 2R is assigned to the lower page which involves neither the 1R nor the FR and which is established by three reading operation. The cache memory is released when the BR is completed.

Figure 35:
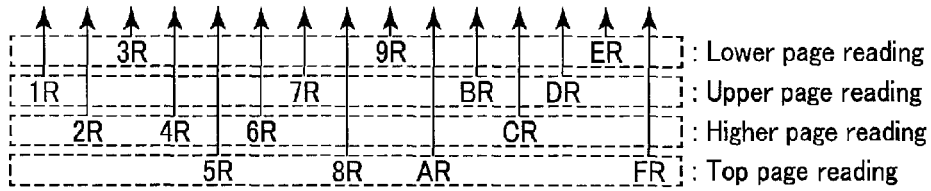

FIG. 35 depicts a pattern for a different assignment with respect to FIG. 29 described in the tenth embodiment. In each mapping, the 1R and the FR are assigned to different pages, the ER is assigned to the lower page which involves neither the 1R nor the FR and which is established by three reading operation. The cache memory is released when the CR is completed.

Figure 36:
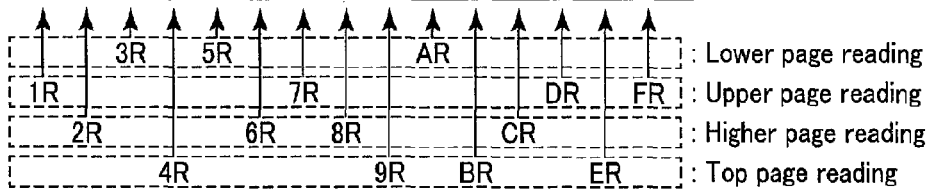

In an example in FIG. 36, the cache memory is released during the AR, and this configuration is excellent in terms of latency.

Figure 37:
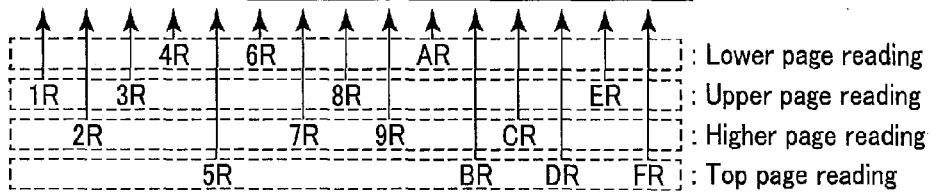
Figure 44:
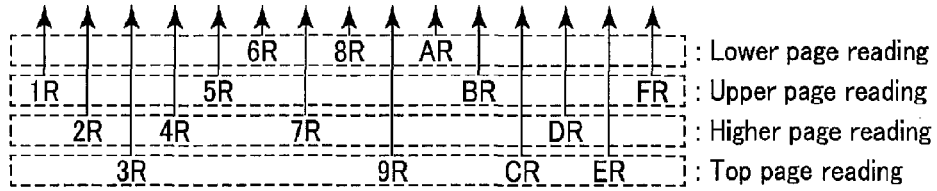

In an example in FIG. 37, the 1R and the FR are assigned to different pages, and this is preferable in view of the reliability of reading. Furthermore, the cache memory is released at the AR.

FIG. 38 depicts a pattern for a different assignment with respect to FIG. 29 described in the tenth embodiment, and is similar to FIG. 35.

In examples in FIGS. 39 and 43, the 1R and the FR are assigned to different pages, and the cache memory is released at the BR.

In examples in FIG. 40, FIG. 41, FIG. 42, and FIG. 44, the cache memory is released at the CR, the BR, the AR, and the AR.

As described above, such mappings as those in FIGS. 32 to 44 may be used as examples of the 3-4-4-4 mapping.

12. Twelfth Embodiment

Now, a semiconductor memory device according to a twelfth embodiment will be described. The present embodiment relates to a modification of the 3-3-4-5 mapping described in the fifth embodiment.

Figure 45:
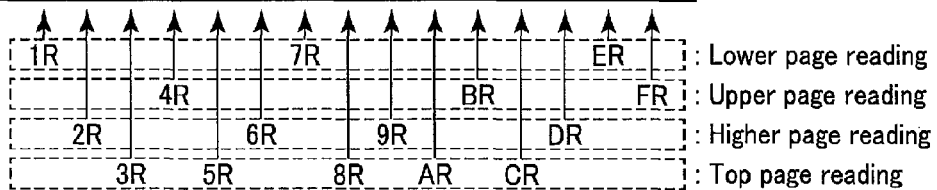
Figure 46:
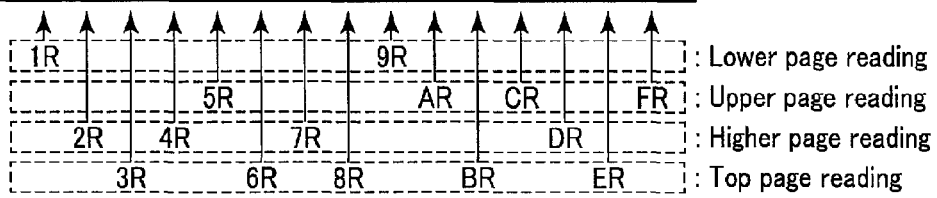

FIG. 45 is a diagram illustrating possible data and read levels for the memory cell transistors according to the present example, and corresponds to the FIG. 15 described in the fifth embodiment and from which the illustration of the threshold distribution is omitted.

FIG. 45 depicts a pattern for different assignments with respect to FIG. 15 described in the fifth embodiment. In the present example, the 1R and the FR are assigned to different pages for which the data is established by three reading operations. Furthermore, the cache memory is released when the BR is completed.

As described above, the pattern in FIG. 45 may be used as an example of the 3-3-4-5 mapping.

13. Thirteenth Embodiment

Now, a semiconductor memory device according to a thirteenth embodiment will be described. The present embodiment relates to a modification of the 2-4-4-5 mapping described in the sixth and seventh embodiments.

FIGS. 46 to 49 depict patterns for different assignments with respect to FIG. 18 described in the sixth embodiment. As depicted in FIGS. 46 to 49, in any of the patterns, the 1R and the FR are assigned to different pages, and the 1R is assigned to a page (in the illustrated example, the lower page) for which the data is established by two reading operations.

FIGS. 50 to 53 depict patterns for different assignments with respect to FIG. 21 described in the seventh embodiment. As depicted in FIGS. 46 to 49, in any of the patterns, the 1R and the FR are assigned to different pages, and the FR is assigned to a page (in the illustrated example, the lower page) for which the data is established by two reading operations.

As described above, the patterns in FIGS. 46 to 53 may be used as examples of the 3-3-4-5 mapping.

14. Thirteenth Embodiment

Now, a semiconductor memory device according to a fourteenth embodiment will be described. The present embodiment relates to a method for detecting the threshold distribution and the read levels for reading of the pages which are described in the first to thirteenth embodiments.

Data writing is executed by, for example, a command sequence depicted in FIG. 54. An example in FIG. 54 illustrates a case where the data of the four pages of the lower page, the upper page, the higher page, and the top page is input to the sense amplifier 140 and then the data of four pages is collectively written (such a writing method is referred to as full sequence programming). "80h" is a command declaring that a write address is to be input. Furthermore, a command "xyh" is a command that allows data input to the XDL to be transferred to the corresponding latch circuits ADL, BDL, CDL, and DDL. The input of the command "xyh" allows the data input to the XDL, for example, the lower page data, to be transferred to the latch circuit DDL and allows the upper page data to be transferred to the CDL. After the top page is input to the XDL, a command "10h" is input to allow four pages of data to be written at once. More specifically, a program voltage is applied to the selected word line WL to program the data, and then, program verification is sequentially performed on the "0" to "F" data. The programming and the verification are repeated to allow four pages of data to be written.

By way of example, a case is assumed where the mapping in FIG. 3 described in the first embodiment is applied. It is assumed that a writing operation is performed with all the bits of the lower page data set to "0" and with the upper page, the higher page, and the top page set to be random data.

A threshold distribution formed in this case is as depicted in FIG. 55. That is, the flowing are written: "2" data ("1010"), "3" data ("1000"), "A" data ("1100"), "B" data ("0100"), "C" data ("0000"), "D" data ("0010"), "E" data ("0110"), and "F" data ("0111") all of which have lower bits of "0". The threshold distribution for the plurality of memory cell transistors connected to the selected word line is such that the memory cell transistors have levels corresponding to the data.

The threshold distribution depicted in FIG. 55 may be actually examined by utilizing a shift read (retry read) command. The shift read command is a command that allows the data to be read with a read voltage VCGRV to be applied to the selected word line changed to any value. For example, the data is read with the VCGRV discretely varied from a voltage V2 to a voltage V4 to allow a threshold distribution for the "2" data and the "3" data to be obtained.

The above-described operation is also performed on the upper page, the higher page, and the top page to obtain detailed data on 16 distributed thresholds and to allow the read level assigned to each page to be found.

For example, when all the bits of the upper page data are "0", a threshold distribution is formed which corresponds to "3" data, "4" data, "5" data, "8" data, "9" data, "A" data, "B" data, and "C" data. Furthermore, when all the bits of the higher page data are "0", a threshold distribution is formed which corresponds to "1" data, "2" data, "3" data, "4" data, "5" data, "6" data, "7" data, "C" data, and "D" data. Additionally, when all the bits of the top page data are "0", a threshold distribution is formed which corresponds to "5" data, "6" data, "7" data, "8" data, "B" data, "C" data, "D" data, and "E" data.

The read level may be determined to be a level between a threshold distribution formed as a result of write of the page data and a threshold distribution not formed as a result of write of the page data. More specifically, for example, in the example in FIG. 55, the distribution of the "1" data is formed, but a threshold distribution for the "2" data is formed, indicating that the voltage V2 is the read level. Likewise, the voltages V4 and VA are determined to be read levels for the lower page.

The above-described method is executed when data reading is based on sequential reading, and such a measure is not particularly needed when the data is read in a page-by-page manner. That is, the read level for each page can be detected by observing the voltage of the word line when the page is read.

15. Modifications and the Like

As described above, the semiconductor memory device according to the present embodiment includes memory cell configured to hold 4-bit data according to the threshold. The first bit (ex. lower in FIG. 3) of the 4-bit data is established by the reading operations (ex. 2R, 4R, AR in FIG. 3) using the first to third read levels (ex. V2, V4, VA in FIG. 3). The second bit (ex. upper in FIG. 3) of the 4-bit data different from the first bit is established by the reading operations (ex. 3R, 6R, 8R, DR in FIG. 3) using the fourth to seventh read levels (ex. V3, V6, V8, VD in FIG. 3). The third bit (ex. higher in FIG. 3) of the 4-bit data different from the first and second bits is established by the reading operations (ex. 1R, 7R, CR, ER in FIG. 3) using the eighth to eleventh read levels (ex. V1, V7, VC, VE in FIG. 3). The fourth bit (ex. top in FIG. 3) of the 4-bit data different from the first to third bits is established by the reading operations (ex. 5R, 9R, BR, FR in FIG. 3) using the twelfth to fifteenth read levels (ex. V5, V9, VB, VF in FIG. 3). The first to fifteenth read levels are different voltages.

Alternatively, the first bit of the 4-bit data is established by the reading operations using the first to third read levels. The second bit of the 4-bit data different from the first bit is established by the reading operations using the fourth to sixth read levels. The third bit of the 4-bit data different from the first and second bits is established by the reading operations using the seventh to tenth read levels. The fourth bit of the 4-bit data different from the first to third bits is established by the reading operations using the eleventh to fifteenth read levels (FIGS. 15 to 17).

Alternatively, the first bit of the 4-bit data is established by the reading operations using the first and second read levels. The second bit of the 4-bit data different from the first bit is established by the reading operations using the third to sixth read levels. The third bit of the 4-bit data different from the first and second bits is established by the reading operations using the seventh to tenth read levels. The fourth bit of the 4-bit data different from the first to third bits is established by the reading operations using the eleventh to fifteenth read levels (FIGS. 18 to 22).

The present configuration provides a NAND flash memory that can hold 4-bit data (16-level data) and that enables a reduction in the rate of occurrence of errors during reading for establishing the bits, allowing the reliability of reading operations to be improved.

The above-described embodiments may be modified. For example, as is the case with second and fourth embodiments, the mirror pattern of the mapping described in the fifth to thirteenth embodiments may be used. Furthermore, a concept similar to the concept in the above-described embodiments is applicable to a NAND flash memory that can hold at least 5-bit data (32-level data). Additionally, the concept is applicable not only to NAND flash memories but also to semiconductor memories in general in which memory cells can hold multi-bit data.

In addition, the possible relations between the "0" to "F" data and the lower bit, upper bit, higher bit, and top bit are not limited to the relations in the above-described embodiments. The relations may be the 3-4-4-4 mapping, the 3-3-4-5 mapping, and the 2-4-4-5 mapping, and in this case, the number of bits changing between adjacent threshold levels may be 1 bit. Among such mappings, the mappings the specific examples of which have been described above in the embodiments are desirably used when improvement of the reliability of reading and/or the improvement of latency is noted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a memory cell configured to hold 4-bit data according to a threshold;
a word line connected to the memory cell; and
a row decoder configured to apply the first to fifteenth read levels to the word line, wherein
a first bit of the 4-bit data is established by reading operations using a first read level to a third read level,
a second bit of the 4-bit data is established by reading operations using a fourth read level to a seventh read level, the second bit being different from the first bit,
a third bit of the 4-bit data is established by reading operations using an eighth read level to an eleventh read level, the third bit being different from the first and second bits,
a fourth bit of the 4-bit data is established by reading operations using a twelfth read level to a fifteenth read level, the fourth bit being different from the first to third bits,
the first to fifteenth read levels are different voltages,
the row decoder is configured to apply the first to fifteenth read levels to the word line in an order from a read level of a low voltage to a read level of a high voltage, and
the reading operation using the tenth applied read level first establishes one of the first to fourth bits.

2. The device according to claim 1, wherein, of the first to fifteenth read levels, a read level corresponding to the lowest voltage and a read level corresponding to the highest voltage are used to establish different bits.

3. The device according to claim 1, further comprising:
a holding circuit configured to hold the first to fourth bits read from the memory cell, wherein
the holding circuit outputs the first to fourth bits in an order that the bit is established.

4. The device according to claim 2, wherein, of the first to fifteenth read levels, a read level corresponding to the second lowest voltage and a read level corresponding to the second highest voltage are used to establish different bits.

5. The device according to claim 1, wherein, of the first to fifteenth read levels, a read level corresponding to the lowest voltage, a read level corresponding to the second lowest voltage, a read level corresponding to the highest voltage, and a read level corresponding to the second highest voltage are used to establish different bits.

6. A semiconductor memory device, comprising:
a memory cell configured to hold 4-bit data according to a threshold;
a word line connected to the memory cell; and
a row decoder configured to apply the first to fifteenth read levels to the word line, wherein
a first bit of the 4-bit data is established by reading operations using a first read level to a third read level,
a second bit of the 4-bit data is established by reading operations using a fourth read level to a sixth read level, the second bit being different from the first bit,
a third bit of the 4-bit data is established by reading operations using a seventh read level to a tenth read level, the third bit being different from the first and second bits,
a fourth bit of the 4-bit data is established by reading operations using an eleventh read level to a fifteenth read level, the fourth bit being different from the first to third bits,
the first to fifteenth read levels are different voltages,
the row decoder is configured to apply the first to fifteenth read levels to the word line in an order from a read level of a low voltage to a read level of a high voltage, and
the reading operation using the twelfth applied read level first establishes one of the first to fourth bits.

7. The device according to claim 6, wherein one of the first to third read levels is the lowest voltage of voltages corresponding to the first to fifteenth read levels, and one of the fourth to sixth read levels is the highest voltage of the voltages corresponding to the first to fifteenth read levels.

8. The device according to claim 6, further comprising:
a holding circuit configured to hold the first to fourth bits read from the memory cell, wherein
the holding circuit outputs the first to fourth bits in an order that the bit is established.

9. A semiconductor memory device, comprising:
a memory cell configured to hold 4-bit data according to a threshold;
a word line connected to the memory cell; and
a row decoder configured to apply the first to fifteenth read levels to the word line, wherein
a first bit of the 4-bit data is established by reading operations using a first read level and a second read level,
a second bit of the 4-bit data is established by reading operations using a third read level to a sixth read level, the second bit being different from the first bit,
a third bit of the 4-bit data is established by reading operations using a seventh read level to a tenth read level, the third bit being different from the first and second bits,
a fourth bit of the 4-bit data is established by reading operations using an eleventh read level to a fifteenth read level, the fourth bit being different from the first to third bits,
the first to fifteenth read levels are different voltages
the row decoder is configured to apply the first to fifteenth read levels to the word line in an order from a read level of a low voltage to a read level of a high voltage, and
the reading operation using the ninth or eleventh applied read level first establishes one of the first to fourth bits.

10. The device according to claim 9, wherein one of the first read level and second read level is the lowest voltage of voltages corresponding to the first to fifteenth read levels.

11. The device according to claim 9, wherein one of the first read level and second read level is the highest voltage of the voltages corresponding to the first to fifteenth read levels.

12. The device according to claim 9, further comprising:
a holding circuit configured to hold the first to fourth bits read from the memory cell, wherein
the holding circuit outputs the first to fourth bits in an order that the bit is established.

13. The device according to claim 1, wherein the reading operation using the twelfth applied read level secondly establishes another one of the first to fourth bits.

14. The device according to claim 6, wherein the reading operation using the thirteenth applied read level secondly establishes another one of the first to fourth bits.

15. The device according to claim 9, wherein the reading operation using the thirteenth applied read level secondly establishes another one of the first to fourth bits.

* * * * *